United States Patent
Hefetz

(10) Patent No.: US 9,697,837 B2
(45) Date of Patent: Jul. 4, 2017

(54) SECURED AUDIO CHANNEL FOR VOICE COMMUNICATION

(71) Applicant: Yaron Hefetz, Kibbutz Alonim (IL)

(72) Inventor: Yaron Hefetz, Kibbutz Alonim (IL)

(*) Notice: Subject to any disclaimer, the term of this patent is extended or adjusted under 35 U.S.C. 154(b) by 0 days.

(21) Appl. No.: 14/109,108

(22) Filed: Dec. 17, 2013

(65) Prior Publication Data

US 2014/0172422 A1   Jun. 19, 2014

Related U.S. Application Data

(60) Provisional application No. 61/737,842, filed on Dec. 17, 2012.

(51) Int. Cl.
*G10L 19/00* (2013.01)
*G10L 15/26* (2006.01)
*G10L 19/16* (2013.01)

(52) U.S. Cl.
CPC ............. *G10L 19/00* (2013.01); *G10L 15/26* (2013.01); *G10L 19/16* (2013.01)

(58) Field of Classification Search
CPC .................................................. G10L 19/002
USPC .......................................................... 704/229
See application file for complete search history.

(56) References Cited

U.S. PATENT DOCUMENTS

| | | | | |
|---|---|---|---|---|
| 6,266,418 B1* | 7/2001 | Carter | ..................... | H04L 9/065 379/442 |
| 7,349,539 B2* | 3/2008 | Wee | ........................ | H04N 7/167 348/E7.055 |
| 2006/0182092 A1* | 8/2006 | Kodaka | .................... | H04L 12/66 370/352 |
| 2007/0154018 A1* | 7/2007 | Watanabe | ........... | H04L 63/0428 380/273 |
| 2009/0198848 A1* | 8/2009 | Chien | ..................... | G06F 3/023 710/72 |
| 2010/0022115 A1* | 1/2010 | Thijs | .................... | H01R 13/443 439/345 |
| 2011/0031985 A1* | 2/2011 | Johnson | .................. | G06F 21/86 324/681 |

* cited by examiner

*Primary Examiner* — David Hudspeth
*Assistant Examiner* — Shreyans Patel
(74) *Attorney, Agent, or Firm* — Guy Levi; The IP Law Firm of Guy Levi, LLC

(57) ABSTRACT

A security device for hindering data theft and data leaks via audio channel of a computer system is based on passing the audio signals through a coding vocoder that receives input audio signal from a computer and compressing the signal to a low bit-rate digital data indicative of human speech; and a decoding vocoder that decompress the digital data back to a secure audio signal. The data transfer of the protected audio channel is intentionally limited not to exceed the bit-rate needed to carry vocoder-compressed human speech which is well below the capabilities of unprotected audio channel. Both analog and digital audio ports may be protected. Hardware bit-rate limiter protect the system from software hacking.

19 Claims, 18 Drawing Sheets

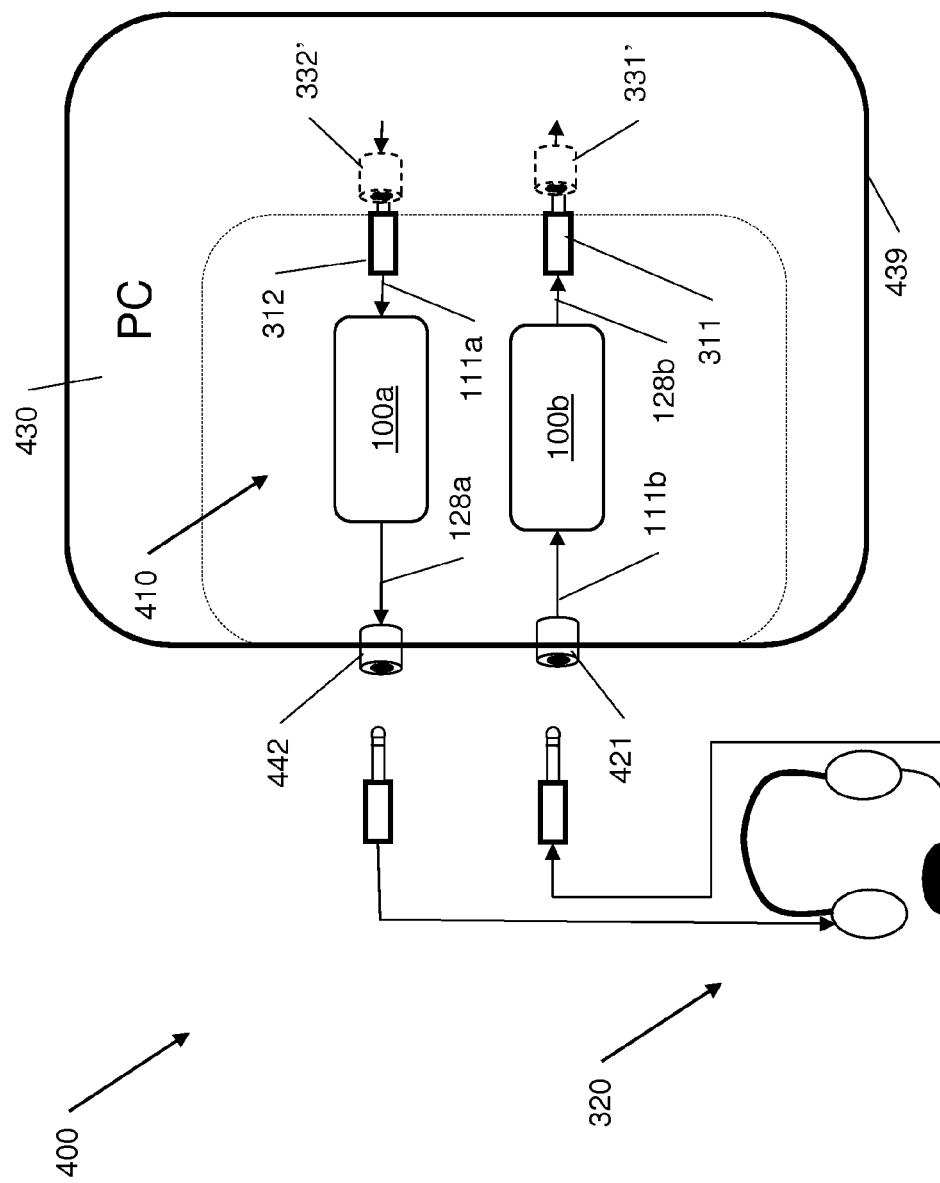

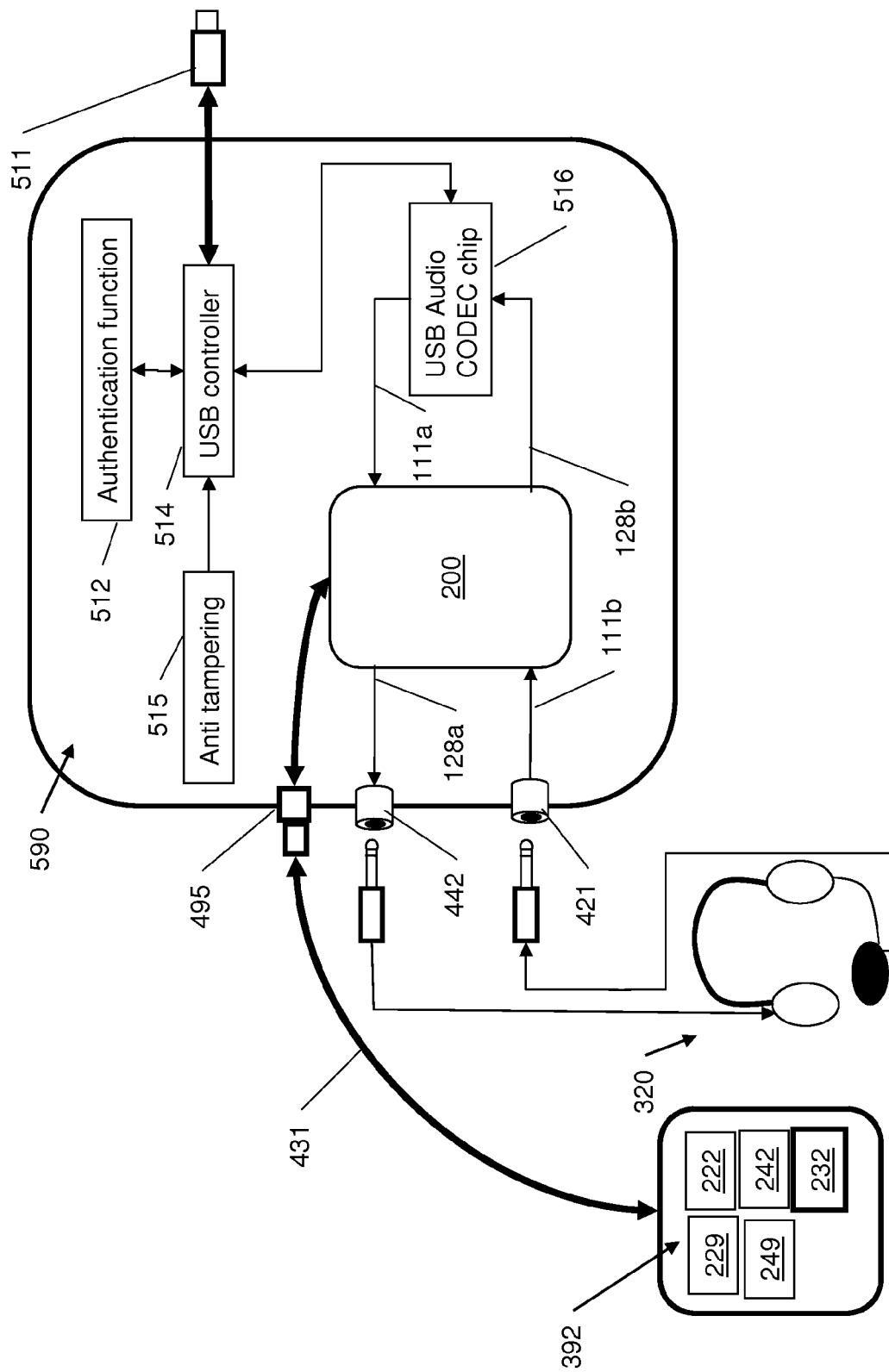

SECURED AUDIO CHANNEL FOR VOICE COMMUNICATION

CROSS REFERENCE TO RELATED APPLICATION

The present invention claims priority from provisional application 61/737,842; titled "SECURED AUDIO CHANNEL FOR VOICE COMMUNICATION"; to Yaron HEFETZ; filed 17 Dec. 2013 which is hereby incorporated by reference in its entirety.

FIELD OF THE INVENTION

Embodiments of the present invention relate to limiting the vulnerability of computer systems to data leaks by limiting the bandwidth of the audio channel while allowing voice communication.

BACKGROUND

Data theft from computers is a serious risk in many organizations. The common use of data storage devices such as USB flash drives, digital cameras, media players and mobile phones that can be easily interfaced with any PC is big security challenge to most organizations. Users may easily download huge number of files in few seconds without leaving any traces. Data theft from computer systems may disclose secret military plans, private medical records, bank accounts information, insurance data, customer database or any other type of data that may be sold or used against the organization interests. Another risk is the data import (or upload) from storage devices that may load hostile code into the organization computing system, or false information. A single event of unauthorized data import into the organization network may cause complete system failure for few hours or even few days. Data Loss Prevention (DLP) becomes a common practice or even mandatory in many high security organizations including: financial, health-care, government and defense.

Over the past years there were several common strategies to secure computer peripheral ports:
1. Security policy regarding mass storage devices.
    Some organizations prohibit users from entering the facility carrying mass storage devices, and some conduct searches at the entrance/exit gates. While this method may be efficient deterrent, it is enough that one employee will bring one device to cause severe damage to the whole organization. Additionally, mass storage devices may be easily concealed or disguised.
2. Physical removal or cover of unused ports.
    Many organizations are using brute force to remove unused peripheral ports from computers that they are purchasing. While this method reduces the risks of open ports, it still allows users to remove allowed peripheral such as keyboard or mouse and plug unauthorized peripheral such as portable mass storage device. It is also expensive task to treat every purchased computer and may void the manufacturer's warranty.
3. USB ports protection by software.
    This method is in extensive use today and it enables complete port disable, or specific port filtering. Organizations may use these software applications to enable only keyboard and mouse to be attached to their computers. One major drawback of any software protection is that it may be disabled or modified by a sophisticated attacker with relative ease. Commercial products for software protection of USB ports are available.
4. Use of secure KVM (Keyboard Video Mouse) to secure coupled computers peripheral ports.
    Several secure KVM units are offering full peripheral ports protection through emulation and unidirectional flow diodes. Combining with USB ports physical or software protection, this method may be used to protect peripheral ports. Another potential option used today is that the PC is located in a secure place or locked from user access while only secure KVM with protected ports is accessible. While this method is relatively secured and efficient, it is generally applicable for users using multiple computers.

PCT patent application WO2011145095; titled "Computer motherboard having peripheral security functions"; to Soffer Aviv; discloses a secure motherboard for a computer, wherein each user-accessible peripheral port is protected by hardware-based peripheral protection circuitry soldered to the motherboard. The protection circuitry provides security functions decreasing the vulnerability of the computer to data theft. User input ports such as keyboard and mouse peripheral ports are coupled to the computer through a security function that enforce unidirectional data flow only from the user input devices to the computer. Display port uses a security function which isolates the EDID in the display from the computer. Authentication device such as smart card reader is coupled to the computer via a port having a security function which enumerates the authentication device before coupling it to the computer.

Computer networks in many organizations are continuously challenged by various security threats. The popularity of the internet and the availability of portable mass-storage devices introduce severe internal and external threats to most organizations. Defense and government organizations with higher security networks are forced to isolate their secure networks from other less secure networks thus creating a situation that a single organization or a single employee need to operate in several different isolated networks having different security levels. Isolation between these networks is a key concern as any leakage of data between two networks may cause catastrophic results to the organization involved.

PCT patent application WO2012095852; titled "Secure KM switch"; to Soffer Aviv; discloses a system enabling a computer user to securely share a single set of Keyboard and Mouse (KM) among multiple isolated computers. As isolated computers may have different security levels, the method and apparatus prevents potential data leakages between computers and coupled networks.

PCT patent application WO2011104715; titled "Secure KVM system having remote controller-indicator"; to Soffer Aviv; discloses a Keyboard Video and Mouse (KVM) switch capable of providing secure remote extension of KVM control and indication functions. The secure KVM provides a secure remote extension of the complete user console with support of: remote keyboard, mouse, one or more displays, smart-card reader, audio devices, KVM control and KVM monitoring.

General background information regarding data transmission over analog telephone lines may be found in open Internet sources.

It should be noted that sophisticated modulation techniques used in MODEMs (MOdulator DEModulator) which were popular in the late 1990's achieved data transmission rate of 56 k baud (56,000 bits per second) over a telephone lines having only 3,700 Hz (300-4,000 Hz) bandwidth over kilometers of twisted-pair electric wires. This represents "Frequency Efficiency" (FE) of ~15. FE is defined as bit-rate divided by bandwidth of the transmission channel. FE strongly depends on the Signal to Noise Ratio (SNR) of the transmission line. For high quality channels, larger FE may be achieved. When no noise and no interference are present on the line, the FE may depends on the effective number of bits used in the Digital to Analog Converter (DAC) used for producing the analog signal at the transmitter end and the Analog to Digital Converter (ADC) used for digitizing the signal at the receiving end of the channel.

For example, "J-QAM, A QAM soundcard modem" is software for converting a standard sound board into a data transmitting/receiving MODEM. The software, which is available to be downloaded from the Internet, is said to enable the use the soundcard to send and receive data by implementing the QAM modulation scheme. Data can be two ways or one way. Any sort of data can be sent, Files, Video, Audio, WebPages etc. It features: Speeds up to 400 kbs with a sound card. Supports QAM16 and QAM64, Eight state TCM encoding. Includes: Interleaved RS forward error correction, Blind equalization, frequency tracking, and Blind carrier frequency and symbol rate detection. QAM is but one modulation technology. OFDM, ADSL and CDMA may also be used.

General information regarding sound quality of modern computers may be found in open Internet sources.

The specifications of the input and output audio channels of conventional PC depend on the type of sound card, or the on-board sound channels used. While top of the line sound cards may reach 192 kHz bandwidth and 32 bits resolution, the typical PC has at least Compact Disk (CD) quality specifications of 44 kHz, 24 bits, stereo input and output channels.

General information regarding computer audio connectors may be found in open Internet sources. The most popular connector is the fully analog 3.5 mm phone connector; these connectors are also often called (mini-)stereo plugs or headphone plugs.

General information regarding efficient compression of audio data representing human speech may be found in open Internet sources.

Modern vocoders (VOice enCODER) can code, transmit, decode and faithfully reproduce human speech using as little as 1,200 bps (Bits Per Second) data rate. Lower bit-rates (600 and down to 200 bps) were demonstrated with varying voice quality, but with reasonable intelligibility.

Vocoders are available as software packages to be executed on the PC's processor, or as dedicated hardware such as ASICS. For example, the AMBE-2020™ Vocoder Chip (Digital Voice Systems, Inc. 234 Littleton Road, Westford, Mass. 01886, USA) is an extremely flexible, high-performance half-duplex voice compression solution that provides exceptional voice quality at rates as low as 2,000 bps. The AMBE-2020™ Vocoder Chip is a low cost, DSP-based voice codec for half-duplex real and non-real time voice compression applications.

General information regarding USB protocol may be found in open Internet sources. It should be noted that popular USB protocol, is capable of high speed data transfer. For example USB 1, released in 1996, specified data rates of 1.5 Mbit/s (Low-Bandwidth) and 12 Mbit/s (Full-Bandwidth). USB 2.0, Released in 2000, added higher maximum signaling rate of 480 Mbit/s.

Streaming video is in wide use by many individual computer users and many organizations. Streaming video is used for various applications today: from entertainment, to video conferencing, on-line events, training, industrial control, remote sensing and security camera feeds. The use of streaming video in modern organizations causes major information security concerns as video is delivered over IP traffic and IP traffic may contain malicious code. Such malicious code inserted into incoming traffic may infect internal organization networks with viruses and Trojans. Code inserted into outbound video traffic may be used to leak classified information to interested parties outside the organization. To reduce the risks involved with inbound streaming video traffic most organizations are using firewalls with preprogrammed set of policies to handle video traffic.

United States Patent Application 20050283536; to Swanson, Jon N. et al; titled "Real time streaming data communications through a security device"; discloses a method of for connecting a plurality of clients to one another over a computer network for communication of real-time streaming data to one another, with at least one of the clients being separated by a security device from the network.

Details some of the risks and difficulties involving video streaming were published on the Interned and in the press.

SUMMARY OF THE EMBODIMENTS

One general aspect of exemplary embodiments of the current invention is to reduce security risk associated with analog audio channels and peripherals (input and/or output) of computer systems. This risk is associated with one or few of the following:

a) the high speed data transfer that audio channels may support that may allow fast download or broadcast of large amount of sensitive data;

b) the difficulty in monitoring the audio channel, automatically or by a human listener, as offensive data may be disgusted as legitimate music or hidden in parts of the spectrum outside the listener's hearing range;

c) the general lack of security and authentication means associated with audio peripherals which are analog in nature (speakers and microphones) and use fully analog jacks and plug (for example such as 3.5 mm Audio-TRS-Mini-Plug) that offer no security measures.

Exemplary embodiments of the invention comprise strongly reducing the type and speed of data that the audio channel may transmit by:

a) compressing the audio data stream by a vocoder to a low bit-rate digital information substantially indicative only of human speech content in the original data;

b) ensuring that the low bit-rate digital information is unidirectional and does not exceed the lowest bit-rate actually needed for transmission of the speech content; and c) decoding the low bit-rate digital information back to standard audio signal with a second decoder.

Not only that the data transfer rate is reduces many folds, the code-decode method used by the vocoders is highly lossy, and strongly distorts signals that are non human speech. This may create a formidable barrier to data transfer such as an attempt to transmit text, figures and other type of files.

It is another general aspect of exemplary embodiments of the current invention is to reduce security risk associated with USB audio channels and USB audio peripherals (input and/or output) of computer systems. While USB devices and ports may be authenticated, they generally create an opportunity to an attacker, as once the security measures ate overcome, high speed and highly versatile channel is opened. Embodiments of the current invention limit the maximum of data transfer via a USB port, and limit the type of data that the USB port can support to transfer of human speech. This is done by:

a) compressing the audio data stream by a vocoder to a low bit-rate digital information substantially indicative only of human speech content in the original data;
b) ensuring that the low bit-rate digital information does not exceed the lowest bit-rate actually needed for transmission of the speech content; and
c) decoding the low bit-rate digital information back to standard audio signal with a second decoder.

This methods and devices allow using the versatility and commercial availability of USB ports, USB protocols, USB peripherals, and USB security measures, while limiting the speed and type to data transfer to human speech. Optionally, very low rate, non-speech data exchange is added, restricted to authentication and control data.

Other interface standards and protocols may be similarly protected. For example RS232, GPIB (IEEE-488), Ethernet WiFi and other protocols such as WAN or LAN protocols, for example used for voice communication such as VoIP (Voice over IP) may be similarly protected. Thus, other interfacing standards may stand for "USB" in this document, and are within the general scope of the current invention. Other sound protocols such as DTS (Digital Theatre System) may also be similarly protected.

It is another general aspect of exemplary embodiments of the current invention is to reduce security risk associated with audio channels and peripherals (input and/or output) used in KM and KVM switches and combiners used in multi-hosts computer systems. While measures has been taken to eliminate or minimize data leaks via the keyboard, mouse and video channels of KM and KVM switches and combiners, the current invention provides security to the audio channels of such KM and KVM systems and apparatuses. This is done by:

a) compressing the audio data stream by a vocoder to a low bit-rate digital information substantially indicative only of human speech content in the original data;
b) ensuring that the low bit-rate digital information does not exceed the lowest bit-rate actually needed for transmission of the speech content; and
c) decoding the low bit-rate digital information back to standard audio signal with a second decoder.

It is another general aspect of exemplary embodiments of the current invention is to reduce security risk associated with audio channels associated with video streaming. While measures have been taken to eliminate or minimize data leaks via the moving pictures in the video, the current invention provides security to the audio channels of that video. This is done by:

a) separating the audio channel from the video streaming data and treating the moving picture separately;
b) compressing the audio data stream by a vocoder to a low bit-rate digital information substantially indicative only of human speech content in the original data;
c) ensuring that the low bit-rate digital information does not exceed the lowest bit-rate actually needed for transmission of the speech content;
d) decoding the low bit-rate digital information back to standard audio signal with a second decoding vocoder; and
e) combining the decoded speech the separately treated moving picture to a combined video.

Applications for this method may be in video conferencing, surveillance and military command centers where moving pictures are associated with human speech.

It is another general aspect of exemplary embodiments of the current invention is to provide additional flexibility, monitoring, security and authentication measures to audio channels and peripherals. Embodiments of the invention may provides one or some of:

a) "normally mute" and timed activation of the audio channel;
b) temporary enablement of "non human speech" (e.g. music);
c) tamper evidence, tamper detection, alert and disablement on tampering attempt;
d) logging of activity and abnormal activity in the audio channel; and
e) authentication of the audio peripherals; and/or authentication of the user of the audio peripherals.

Monitoring the transmission on the audio channel may be done automatically by comparing the input signal to the vocoder to the output after the process of coding, bit rate limiting decoding. Large variation or deviation may indicate an attempt to transmit non human speech. Speech recognition program may be applied to the output. At least a substantial fraction should be recognized in a normal operation. Random sampling may be used to avoid over using the computational resources of the computer system. Logging the users' ID, operation time, duration and amount of data transferred may also be done.

It should be noted that the methods of securing the audio channel according to some exemplary embodiments of the current invention may be embodied as purely software executed on a dedicated or general purpose processor. Such software may be programmed to perform the voice coding, decoding and even the bit rate limiting. Generally, software solutions are prone to hacking, and thus cannot provide high level of security. It may be sufficient however to provide at least one "hacking resistant" element in the audio channel to provide security to the channel. A "hacking resistant" element may be for example the Bit Rate (BR) limiter. Additionally or alternatively, a software based device may be made "hacking resistant" by preventing the possibility of re-programming it. For example, the program may be stored in a read-only memory. A processor, dedicated to the operation of the audio channel (or channels) may be isolated from the computing system and interact with the outside world only via its analog input and outputs or having other protection against re-programming. Optionally, reprogramming may be done via a dedicated port, or using authentication methods.

It also should be noted that guarding against data leaks and data theft should be guaranteed even when the abuser has full access to the computers or the communication systems. For example, the latest mass data theft at the US military and NSA were made by people with user or even administrative privileges. Such abuser may have sophisticated computer skills and may have access to computer tools. Thus, it may be important to prevent, or at least considerably limit the ability to wrongfully retrieve or transmit large amount of data.

One aspect of the invention is to provide an audio security device for a computer system comprising: an outgoing coding vocoder capable of receiving outgoing audio signal and capable of compressing said outgoing audio signal to an outgoing low bit-rate digital data indicative of human speech in said outgoing audio signal; and an outgoing decoding vocoder capable of receiving said outgoing low bit-rate digital data, and capable of decompressing said outgoing low bit-rate digital data to a secure outgoing audio signal, wherein the maximum bit-rate of said outgoing low bit-rate digital data is intentionally limited to bit rate sufficient for transmitting compressed human speech.

In some embodiments the maximum bit-rate of the low bit-rate digital data is limited by a physical non field programmable bit-rate limiter.

In some embodiments the security device further comprises a music ON switch; a music bypass timer, wherein said music bypass timer is activated by said music ON switch; a music On indicator; and a music bypass switch, wherein said music bypass switch and said music ON indicator are activated by said music timer, and wherein said music bypass switch allows the security device to temporarily transfer data above said maximum bit-rate of the low bit-rate digital data while said music bypass switch is activated.

In some embodiments the security device further comprises a tamper detector; and a security function coupled to said tamper detector, wherein said security function disables the operation of the security device when attempt to tamper with the security device is detected.

In some embodiments the security device further comprises an enclosure, wherein said outgoing coding vocoder and said outgoing decoding vocoder are situated within said enclosure.

In some embodiments the security device is situated between a computer and at least one audio device selected from a group consisting of: a speaker; an earphone; a microphone and a headset.

In some embodiments the security device is integrated into a computer such that analog audio output from said computer is routed only via the security device.

In some embodiments the security device further comprises an ingoing encoding vocoder capable of receiving ingoing audio signal and capable of compressing said ingoing audio signal to an ingoing low bit-rate digital data indicative of human speech in said ingoing audio signal; and an ingoing decoding vocoder capable of receiving said ingoing low bit-rate digital data, and capable of decompressing said ingoing low bit-rate digital data to a secure ingoing audio signal, wherein the maximum bit-rate of said ingoing low bit-rate digital data is intentionally limited to bit rate sufficient for transmitting compressed human speech.

In some embodiments the security device further comprises an enclosure, wherein said outgoing encoding vocoder; said outgoing decoding vocoder; said ingoing encoding vocoder; and said ingoing decoding vocoder are situated within said enclosure.

In some embodiments the security device further comprises a microphone plug, coupled to said ingoing decoding vocoder for plugging into an input jack of a computer; and earphone plug, coupled to said outgoing encoding vocoder for plugging into an output jack of the computer; and lock for locking said enclosure to the computer, wherein said enclosure covers the input jack and the output jack and prevents accessing them when said enclosure is locked to the computer.

In some embodiments the enclosure further comprises: a output audio jack coupled to said outgoing decoding vocoder; and an audio input jack coupled to said ingoing encoding vocoder.

In some embodiments the security device further comprises a digital audio interface for interfacing with at least one audio device selected from a group consisting of: a speaker; an earphone; a microphone and a headset; and a CODEC function interfacing said digital audio interface with said ingoing encoding vocoder and said outgoing decoding vocoder.

In some embodiments the CODEC function is a USB CODEC.

In some embodiments the security function further logs activity of said security device.

In some embodiments the security device further comprises an authentication device coupled to said security function.

Another aspect of the invention is to provide a computer system having secure audio channel comprising: at least a first computer having a first audio output channel; an output coding vocoder, capable of receiving output audio signal from an output audio channel, said output coding vocoder is capable of compressing the output audio signal to an output low bit-rate digital data indicative of human speech in the output audio signal; an output decoding vocoder, receiving said output low bit-rate digital data and capable of decompressing said output low bit-rate digital data to a secure output audio signal, wherein the maximum bit-rate of said output low bit-rate digital data is intentionally limited to bit rate sufficient for transmitting compressed human speech; and an audio voice sounding peripheral capable of being coupled to the output decoding vocoder.

In some embodiments the first computer further having a first input audio channel, and the system further comprises: a microphone, for generating input audio signal; an input coding vocoder, capable of receiving input audio signal from said microphone, wherein said input coding vocoder is capable of compressing the input audio signal to an input low bit-rate digital data indicative of human speech in said input audio signal; an input decoding vocoder, receiving said input low bit-rate digital data and capable of decompressing said input low bit-rate digital data to secure input audio signal, wherein the maximum bit-rate of said input low bit-rate digital data is intentionally limited to bit rate sufficient for transmitting compressed human speech, and wherein said input decoding vocoder is capable of transmitting said secure input audio signal to an input audio channel of a computer; at least a second computer having a second audio output channel and a second audio input channel; and an audio switch capable of switching said microphone and said audio voice sounding peripheral to audio channels of a selected one of said first or said second computer at a time, wherein audio signals into and out of said selected one of said first or said second computer is always routed via coding vocoder and a decoding vocoder.

Yet another aspect of the invention is to provide a method for hindering data leaks and data theft via audio channel of a computer system, the method comprising: receiving audio signal; compressing said audio signal to a low bit-rate digital data indicative of the human speech in said input signal using a coding vocoder; intentionally limiting the maximum bit-rate of said low bit-rate digital data to bit rate sufficient for transmitting compressed human speech; and decompressing said low bit-rate digital data to audio signal using a decoding vocoder.

In some embodiments the method further comprises: monitoring the audio signals for attempt to transmit non-human speech data; and disabling the transmission of signals when attempt to transmit non-human speech data is detected.

In some embodiments the audio signal is extracted from composite video signal.

A security device for hindering data theft and data leaks via audio channel of a computer system is provided, based on passing the audio signals through a coding vocoder that receives input audio signal from a computer and compressing the signal to a low bit-rate digital data indicative of human speech; and a decoding vocoder that decompress the digital data back to a secure audio signal. The data transfer of the protected audio channel is intentionally limited not to exceed the bit-rate needed to carry vocoder-compressed human speech which is well below the capabilities of unprotected audio channel. Both analog and digital audio ports may be protected. Hardware bit-rate limiter protect the system from software hacking.

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, suitable methods and materials are described below. In case of conflict, the patent specification, including definitions, will control. In addition, the materials, methods, and examples are illustrative only and not intended to be limiting.

Unless marked as background or art, any information disclosed herein may be viewed as being part of the current invention or its embodiments.

BRIEF DESCRIPTION OF THE FIGURES

For a better understanding of the invention and to show how it may be carried into effect, reference will now be made, purely by way of example, to the accompanying drawings.

With specific reference now to the drawings in detail, it is stressed that the particulars shown are by way of example and for purposes of illustrative discussion of selected embodiments of the present invention only, and are presented in the cause of providing what is believed to be the most useful and readily understood description of the principles and conceptual aspects of embodiments of the invention. In this regard, no attempt is made to show structural details in more detail than is necessary for a fundamental understanding of the embodiments; the description taken with the drawings making apparent to those skilled in the art how the several forms of the invention may be embodied in practice. In the accompanying drawings:

FIG. 4A schematically depicts a computer system with secure audio channels using an internal BRL circuit according to another exemplary of the current invention.

FIG. 5C schematically depicts a secure USB audio peripheral device having the functionality of BRL circuit seen in FIGS. 2, 3B and 4B according to an exemplary embodiment of the current invention.

DESCRIPTION OF SELECTED EMBODIMENTS

Figure 1:
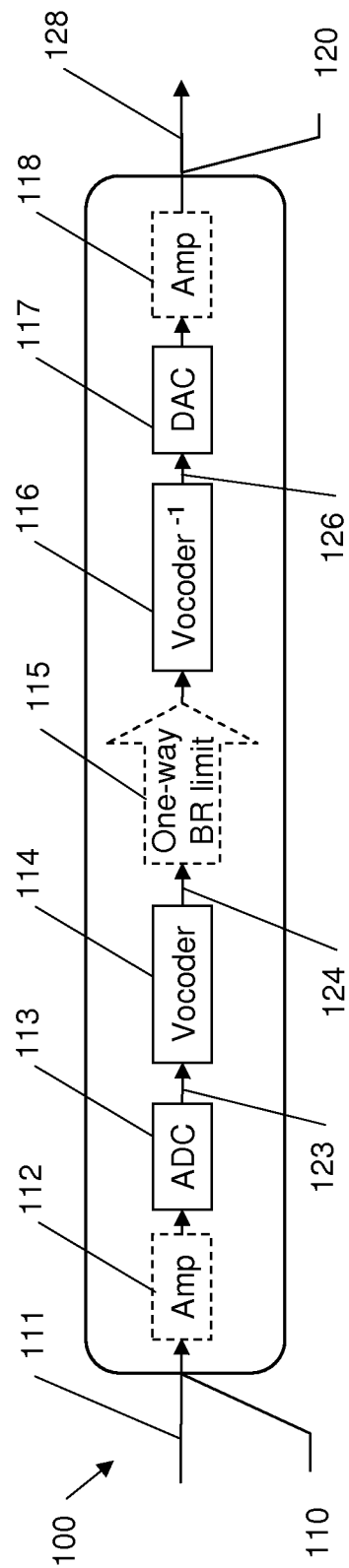
FIG. 1 schematically showing a Bit-Rate Limited audio channel (BRL) according to an exemplary embodiment of the current invention.

Before explaining at least one embodiment of the invention in detail, it is to be understood that the invention is not limited in its application to the details of construction and the arrangement of the components set forth in the following description or illustrated in the drawings. The invention is capable of other embodiments or of being practiced or carried out in various ways. Also, it is to be understood that the phraseology and terminology employed herein is for the purpose of description and should not be regarded as limiting.

In discussion of the various figures described herein below, like numbers refer to like parts.

The drawings are generally not to scale.

Some optional parts were drawn using dashed lines.

For clarity, non-essential elements were omitted from some of the drawings.

To the extent that the figures illustrate diagrams of the functional blocks of various embodiments, the functional blocks are not necessarily indicative of the division between hardware circuitry. Thus, for example, one or more of the functional blocks (e.g., processors, memories, controllers, vocoders, etc.) may be implemented in a single piece of hardware (e.g., a general purpose signal processor, ASIC, FPGA, or random access memory, hard disk, or the like) or multiple pieces of hardware. Similarly, the programs may be stand alone programs, may be incorporated as subroutines in an operating system, may be functions in an installed software package, and the like.

It should be understood that the various embodiments are not limited to the arrangements and instrumentality shown in the drawings.

Embodiments of the current invention are aimed at reducing the vulnerability associated with audio channels of computer systems.

Security methods and devices of the art, as disclosed in the background section are aimed to reduce the risk of data leaks from computers, computer systems and computer networks. However, the audio channels of these systems were not protected. Eliminating the audio channels altogether may not be desirable, as audio channels may be needed for voice communication.

A typical audio channel having stereo channel of 44 kHz bandwidth, may theoretically be used to transmit 2*44,000*15=1.32 Mbps with modest FE of 15. Taking into account of the high quality (24 bits) of the typical PC's audio channel, and the noise free, interference free, and short length of an audio cord, higher values of FE may be achieved.

Thus, an adversary may turn the audio output of a PC into a high data rate transmitter and used it to transfer data from the computer into a recorder, optionally camouflaged as earphone or headset. This data may be later be transmitted to the adversary's home base. As audio channels may be reconfigured, the microphone input of a PC may be configured to act as an output, thus doubling the data transmission rate. To achieve this goal, a data transmitting code is inserted and executed on the computer having access to secret information and produces audio signal coded with the secret information. Such data transmitting code may be a short program, specifically if simple coding is used and low FE may be tolerated. The audio signal coded with the secret information may be used concurrently with the normal operation of the audio channel and appear as low-level noise signal above the human hearing frequency (~12-15 kHz) and thus go undetected even if it is sound over a loudspeaker together with the normal desirable voice communication. Additionally or alternatively, the coded information may appear as low-level pseudo-white noise that is not noticeable by human listener.

Similarly, secret or hostile information may be transmitted to into a computer at high rate using the audio input channel. This vulnerability may be used for inserting large hostile codes into critical computer systems or to alter important data base. A hostile agent, or innocent personnel may plug an audio player, possibly camouflaged as a fake microphone or a headset into the audio input of the computer and transmit the signals that later translates into undesirable information.

Additionally, these vulnerabilities may be used for overcoming security measures aimed at preventing data leaks between different computers and/or computer networks. For example a headset connected via a KVM switch to two computers, a first computer capable of accessing secret information and the second computer capable of communicating with the adversary's base (for example using the Internet), may be used for receiving secret information from the first computer via the audio output, and than transmitting the information via the audio input of the second computer.

Reference is now made to FIG. 1 schematically showing a Bit-Rate Limiting audio channel (BRL) 100 according to an exemplary embodiment of the current invention.

BRL channel 100 receives analog audio signal 111 at its input 110. Optionally the analog signal is amplified by the optional amplifier 112. The signal may be frequency filtered and its level may be equalized using analog circuitry before it is digitized by ADC 113. A coding vocoder 114 receives and compresses the bit-stream 123 from ADC 113 to digital data 124 indicative of the human speech content of the audio signal in the input 110.

Optionally the digital data 124 passes through an optional Bit-Rate (BR) limiter 115 that prevents data transfer at rate higher than a preset maximum bit rate. Since coding vocoder 114 may be entirely or partially implemented in software, a hardware-based bit-rate limiter, BR 115 may be used to reduce the vulnerability of BRL channel 100 to hostile modifications in the software used in coding vocoder 114. Bit-rate limiter BR 115 may optionally include a one-way data flow enforcing circuit capable of enforcing data flow only in the direction from coding vocoder 114, and preventing any data from flowing in the opposite direction. The one-way data flow enforcing circuit may be implemented using diodes, electro-optical units and the likes. However, it should be noted that other elements in BRL channel 100 may serve the same function, for example ADC 113, DAC 117 and amplifies 112 and 118. Digital data 124 is decoded back into decompressed data stream 126 by the complementary (Vocoder$^{-1}$) decoding vocoder 116 which is converted to analog voice signal 128 by DAC 117. Optionally an amplifier 118 is used to amplify the analog audio voice signal 128 before it is connected to a speaker or other audio equipment.

The BRL channel 100 serves the following functions:

It limits the data flow to one direction;

It limits the maximum data rate to the preset value set by the vocoder 114 or the bit-rate limiter 115;

It effectively limits the data transmission to human speech; and

It significantly distorts any non-human speech signals (for example fax or modem audio signals), thus hindering non-speech signal transfer.

It should be noted that the BRL channel 100 of FIG. 1 is a single channel single direction device. As computers may require audio input and output, two BRL devices may be used, one for the input (microphone) channel, and one for the output (speaker or earphone) channel. Microphone channel used for voice communication rarely needs stereo channel, however if needed, for example in a video conferencing where directional hearing may be desirable, two separate channels may be used. In this case, some components may be integrated together, such as dual channel vocoder, etc. Alternatively, the left and right audio channels of stereo audio channel may be combined, for example at the input 110 or at the amplifier 112. Similarly, the output channel used for voice communication rarely needs stereo channel, however if needed, for example in a video conferencing where directional hearing may be desirable, two separate channels may be used. In this case, some components may be integrated together, such as dual channel vocoder, etc. Alternatively, the left and right audio channels may be combined, for example at the input 110 or at the amplifier 112. When the left and right output channels are united at BRL, the output 120 may be made to drive both left and right speakers or both earphones. Clearly, reducing the number of channels from two to one reduces to half the maximum data rate that can be transmitted through the audio channel.

The BRL channel 100 may be integrated and manufactured using electronic technology known in the art. The BRL channel 100 may comprise dedicated ASIC or ASICS, optionally the entire device (optionally having a plurality of channels, or both input and output channels) may be integrated into a single electronic chip. Optionally, parts of the BRL may be implemented as a processor or processors executing software code, or a programmable FPGA. However, to reduce hostile manipulation or unauthorized changes in the software, it may be advisable that at least one critical component in the data path, for example coding vocoder 114, the BR 115 and/or decoding vocoder 116 would be immune to hostile reprogramming, for example implemented in hardware or uses code in a non-volatile read-only memory.

Power for operation of the BRL channel 100 (and other BRL devices depicted below) may be supplied by a battery, a power supply or by the computer it is connected to, for example via a USB or other powered port. For drawing clarity, power supplying subunit is not drawn in this or other figures.

It should be noted that coding vocoder 114 and/or decoding vocoder 116 may be constructed to equalize the voice to a reference level, or to ignore voice below a preset threshold level. This will defeat attempts to transfer data at sound level too low to be noticed by the user. Any attempt to transfer data through BRL channel 100 would sound as garbled speech, alerting the user that unauthorized activity is taking place.

While BRL channel 100 appears herein as a single unit, it may be embodied in several parts. For example, vocoder 114 and optional BR limiter 115 may be situated in the computing device transmitting the audio, and vocoder 116 at the receiving end.

Figure 2:
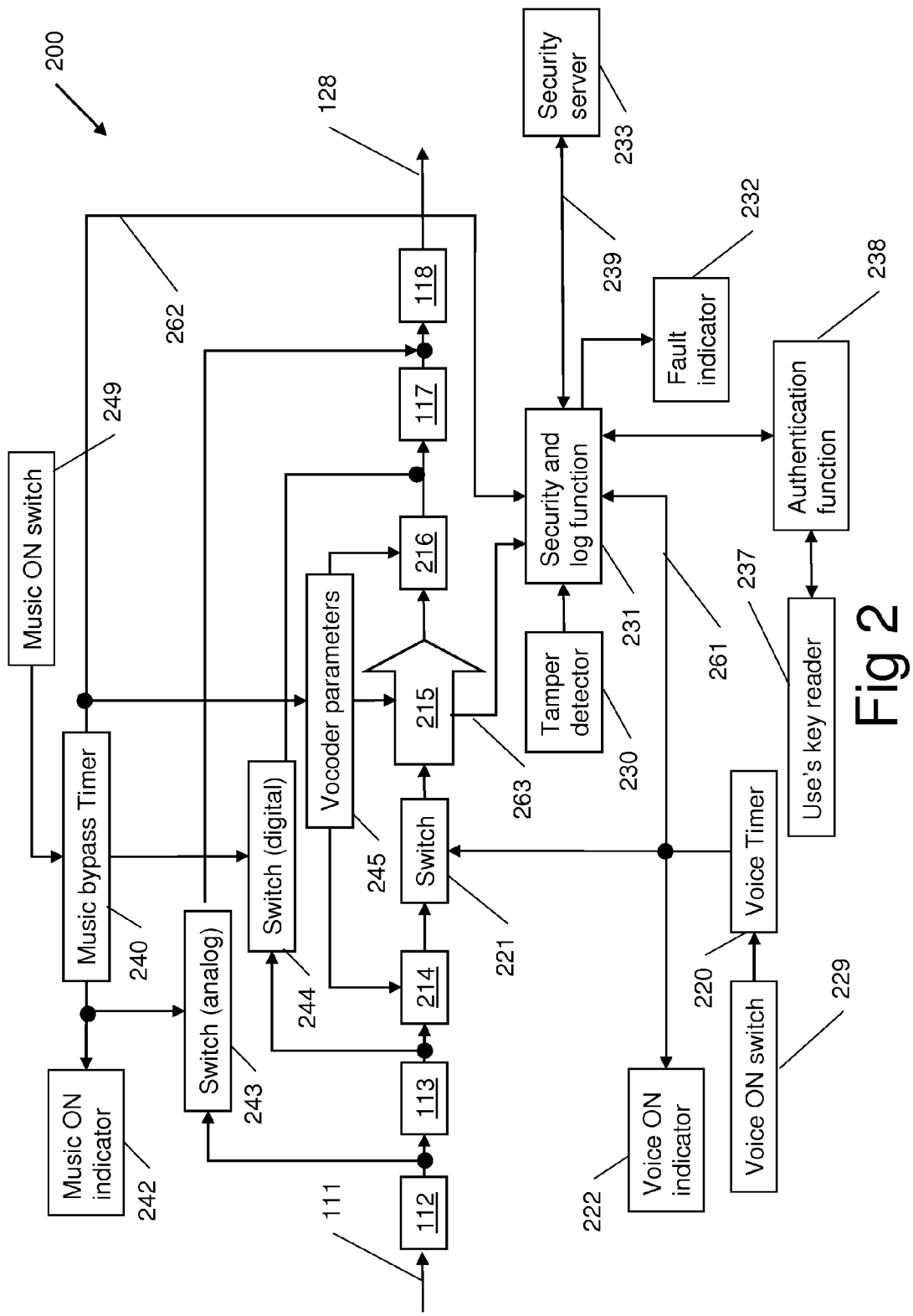
FIG. 2 schematically depicts a block diagram of a BRL circuitry according to another exemplary embodiment of the current invention.

FIG. 2 schematically depicts a block diagram of a BRL circuitry 200 according to another exemplary embodiment of the current invention.

Optionally the BRL channel may comprise additional optional functionalities. For drawing clarity only one audio channel is seen, but it should be noted that duplex (input and output) and/or stereo channels may be used within the scope of the invention. Furthermore, the input and output channels may be or may not identical. For example, audio output may be stereo while the input only mono, or the voice quality may not be the same, or other variations and combinations. Optionally, the operation of the input channel and the output channel may not be identical. For example, output (speaker) channel may be enabled at all times, while input (microphone) channel may be operated in a "push to talk" mode.

In an exemplary embodiment of the invention, the audio channel is not open at all times, but only open on command of the user, for example by manually activating the voice ON switch 229. Optionally, voice ON switch 229 is a toggle switch and voice channel is on as long as the voice switch 229 is in "ON" position. Alternatively, voice ON switch 229 is a momentary switch that activates a voice timer 220 for a preset duration, and then turns off the voice channel. Activation of voice transmission may optionally be done by activation data switch 221 inserted anywhere along the audio signal or data path. Alternatively, voice transmission may optionally be done by activation any of the components crucial for the operation of the channel such as amplifiers 112 or 118, ADC 113, coding vocoder 214 or decoding vocoder 216 or BR 215. Optionally, a visual indicator such as voice ON indicator 222 is activated to alert the user that voice transition is enabled.

In some embodiments, BRL circuitry 200 is further capable of transmitting audio signals other than human speech, for example music or other high fidelity audio signals. To enable transmitting audio signals other than human speech, the user activates the optional music ON switch 249. In an exemplary embodiment of the invention the music ON switch 249 is a toggle switch and music bypass is on as long as the music ON switch 249 is in "ON" position. Alternatively, music ON switch 249 is a momentary switch that activates a music bypass timer 240 for a preset duration, and then turns off the music bypass. Activation of music bypass may optionally be done by one or few of the following:

Activation of analog switch 243 that directs the analog signal from the input to the output, bypassing the entire digital circuitry;

Activation of raw digital switch 244 that directs ADC data from ADC 113 to DAC 117, bypassing the coding vocoder 214 and decoding vocoder 216 and the BR 215; or Activation of vocoder parameters unit 245 which controls the operation of coding vocoder 214 and decoding vocoder 216 and BR 215 to allow higher quality audio to pass through the BRL.

Optionally, a visual indicator such as music ON indicator 242 is activated to alert the user that music transition is enabled.

Optionally, BRL circuitry 200 further comprises security measures such as tamper detector 230 which is activated if the enclosure of the device is opened, device is removed or disconnected, or other attempt to modify the device is detected. Optionally, the tamper detector is connected to a security function 231 which disables the operation of the BRL if the tamper detector is activated. Optionally, a fault indicator 232 alerts the user if the tamper detector was activated. Optionally, security function 231 is further connected to an external security server 233 via reporting link 239. Security server 233 may be a remote server, or it may be an application operated at the computer which the BRL circuitry 200 is operated with. Optionally, the audio functions of the computer which the BRL circuitry 200 is operated with are halted once a fault is indicated by security function 231. Alternatively, the audio functions of the computer which the BRL circuitry 200 is operated only if security function 231 is in no-fault state. Optionally, security function 231 is further capable of logging and reporting information regarding the operation of BRL circuitry 200, for example times, number and durations of activations of voice ON and/or music ON switches, and/or the rate and total number of bits transmitted through the BRL circuitry 200 as reported by the voice timer, the music bypass timer and the BR 215 via lines 261, 262 and 263 respectively. In some embodiments, reporting link 239 and security server 233 are missing so as not to create another channel of attacking the computer. Other methods of securing reporting link 239 may be used. A monitoring program that monitors the use of the audio channel may be used to detect unauthorized or suspicious activity. For example an increase of data transmission through the channel, or activity in unusual hours which may indicate possible abuse of the audio channel. Optionally, the security function 231 is capable of permanently disable the operation of the BRL circuitry 200 when attempt to abuse it is detected.

Optionally, the BRL circuitry 200 is encased in a tamper resistant enclosure, and the tamper detector 230 is powered by a battery or a capacitor such that an attempt to open the enclosure is detected even when the BRL circuitry 200 is not powered. Optionally, the BRL circuitry 200 is encased in solid resin such as epoxy to prevent tampering with it.

Additionally and optionally, BRL circuitry 200 may comprise an authentication function 238. Authentication function 238 may comprise a unique ID, or other authentication device or algorithm that allows the security server 233 to verify that BRL circuitry 200 is an approved device. In some embodiments, Security server 233 will not enable audio transmission without such verification. Authentication function 238 may optionally comprise a user authentication device such as fingerprint reader, a card reader, or other user's key reader 237 that unlock the BRL circuitry 200 for audio transmission. In some embodiments, a combined verification has to take place wherein the user is authenticated at the PC, for example by using an ID and password, the PC verify that the BRL circuitry 200 is an approved device, and the user is authenticated at the BRL circuitry by inserting his user's key into the authentication function 238 before audio transmission may commence. Optionally, logging function 231 logs and report the user's ID as determined by the user's key.

It should be noted that voice ON switch 220 and/or music ON switch 249 may be a "push to talk" or "push to listen" type, and different switches may be used for the input and output channels. For example, the microphone channel may be a "voice only", mono channel activated by a "push to talk" switch, while the speaker channel may be a stereo channel, set for voice transmission at all times, with a toggle music ON switch. Other variations and combinations may apply. Preferably the security and logging function 231 logs the operation of both the input and output channels.

Figure 3A:
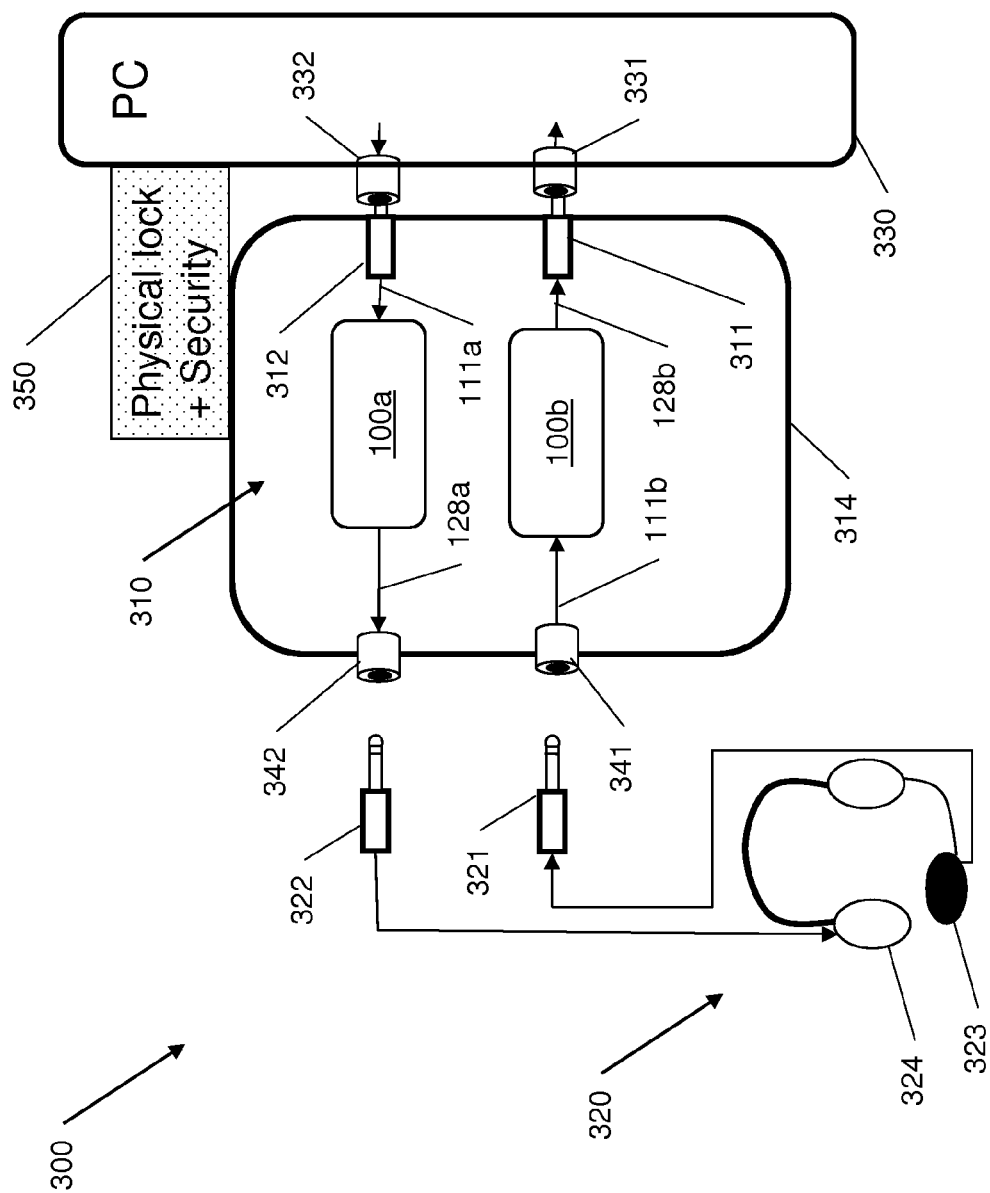
FIG. 3A schematically depicts a computer system with secure audio channels using an externally mounted BRL unit according to another exemplary of the current invention.

FIG. 3A schematically depicts a computer system 300 with secure audio channels using an externally mounted BRL unit 310 according to another exemplary of the current invention.

Computer system 300 comprises a computer such as a standard PC 330 having standard input jack 331 and standard output jack 332. It should be noted that the terms "PC" or "computer" (such as PC 330 in this figure) may stand in this document for variety of computer, communication device or computer peripheral having at least one audio channel and are susceptible to data leaks. Non-limiting examples may be a Personal Computer (PC), a laptop computer, a tablet computer, a Smartphone, a KVM unit, a terminal, a PDA and the likes. Other components of the PC and/or its peripherals are not seen for drawing clarity. If computer 330 has more audio Input Output (I/O) jacks, they are preferably permanently disabled, blocked or destroyed. Alternatively the other audio I/O jacks are also protected.

Computer system 300 further comprises audio peripherals such as a microphone, speakers and/or earphone, represented in this figure by a analog headset 320. Headset 320 may be a standard analog headset 320 having a microphone 323 connected to microphone plug 321 and at least one earphone 324 connected to earphone plug 322.

To prevent high speed data transfer via audio I/O jacks 331 and 332, BRL unit 310 is attached to PC 330 such that its microphone plug 311 is plugged into input jack 331 and its earphone plug 312 is plugged into output jack 332. BRL unit 310 comprises a casing 314 that covers input jack 331 and output jack 332 and prevents accessing them. Casing 314 is permanently attached or glued to PC 330, or is locked with a physical lock 350 to the PC casing such as to prevent unauthorized access to input jack 331 and output jack 332. Optionally, a security label (not seen in this or other figures) is attached to the casing 314 such that opening the casing requires tearing the label. Optionally, a security label (not seen in this or other figures) is attached to the casing 314 and the enclosure of PC 330 such that accessing input jack 331 and output jack 332 requires tearing the label.

BRL unit 310 may comprise a side by sided BRL channels 100x (herein "x" stands for the letters "a", "b", etc. to indicate similar or identical elements). Alternatively, BRL unit 310 may comprise at least one BRL circuitry 200 instead of one of the BRL channels 100x. Alternatively each of the BRL channels 100x is replaced with BRL circuitry 200. It should be noted that the number of audio channels may be more or less than the two seen in this and other figures. Optionally, the logging and/or anti-tampering components of BRL circuitry 200 are implemented into BRL unit 310. Optionally, anti-tampering components are capable of detecting unauthorized removal of BRL unit 310. For example unauthorized removal may be sensed by physical lock 350. Optionally, physical lock 350 is connected to the security function 231. It should be noted that one security and logging function may serve both (or a plurality) of BRL circuitries 200.

In the depicted embodiment, analog audio signal 111a from the computer PC 330 is converted to analog voice signal 128a by output BRL channel 100a and is sent to the earphones of headset 320 via output jack 342. Similarly, analog audio signal 111b from microphones of headset 320 received via input jack 341 is converted to analog voice signal 128b by input BRL channel 100b and is sent to the computer PC 330.

Without the use of BRL unit 310, an attacker may connect a high quality sound recorder or a modem to the audio output 332 of the PC 330, execute a simple program that modulate the audio output creating signal indicative of secret information to audio signals and download that information. Alternatively, an attacker may conceal a recording device in a fake or doctored headset (which may include filters to avoid sounding the coded data, and thus performs as normal headset). Alternatively, a fake hearing-aid, concealed in the user's ear canal may be used as a sound recorder. If coded information uses only the "above hearing" part of the spectrum, or at levels below the human perception, data loading/downloading may be undetected and concurrent with normal operation.

As a non limiting example, transmitting a data set of 100 MB (800,000.000 bits) would require only 10 minutes using the audio channel capacity (assuming data rate of 1.3 Mbps in each of the stereo channels); while it will require 15 days if the BR is set to 600 bps maximum rate (assuming that the BR channel is a mono channel). Moreover, a very sophisticated data coding is needed to avoid the lossy and distorting coding-decoding of the vocoder pair, this may further inhibit general data transfer and further reduces the actual data transfer rate via the secure audio channel.

Figure 3B:
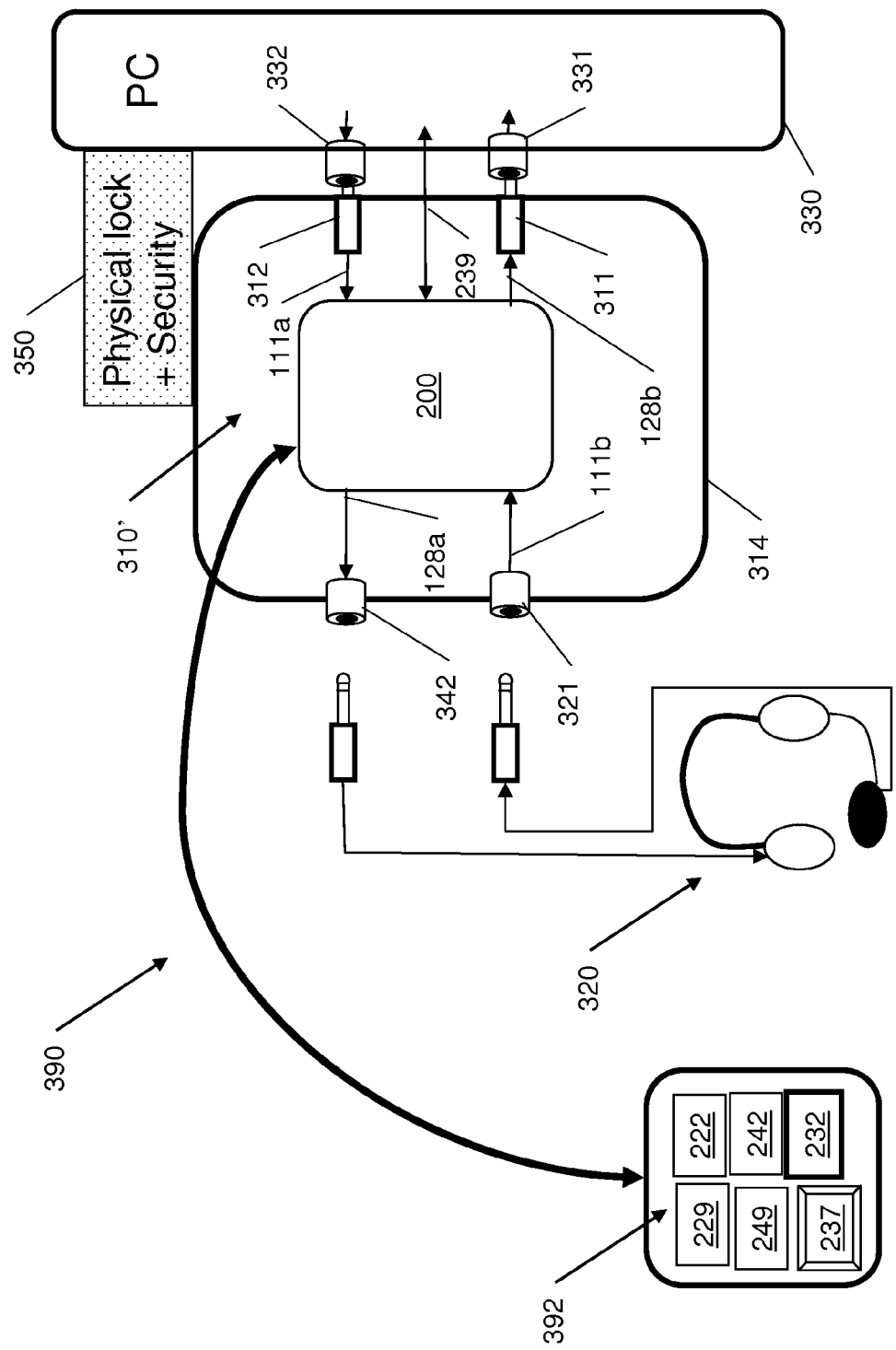
FIG. 3B schematically depicts a computer system with secure audio channels using an externally mounted BRL unit according to another exemplary of the current invention.

FIG. 3B schematically depicts a computer system 390 with secure audio channels using an externally mounted BRL unit 310' according to another exemplary of the current invention.

When BRL unit 310' comprise voice timer and/or music bypass capabilities (as depicted in BRL circuitry 200 of FIG. 2), some or all of the controls, such as voice ON switch 229 and/or music ON switch 249 may be placed remotely from casing 314, for example in a remote controlling unit 392 optionally attached to, or integrated into headset 320. Similarly, indicators such as Voice ON indicator 222, Music ON indicator 242, and/or Fault indicator 232 may be located remotely from casing 314 and visible to the user of computer system 390. Alternatively, indicators such as Voice ON indicator 222, Music ON indicator 242, and/or Fault indicator 232 may be located remotely from casing 314 in a display unit (not seen in this figure), while some or all of the controls, such as voice ON switch 229 and/or music ON switch 249 may be placed remotely from casing 314, for example in a separate remote controlling unit (not seen in this figure) placed near, attached to, or integrated into headset 320.

Alternatively, as often done in highly secure computer systems, PC 330 is placed in a secure locked box, or in a locked room and the user accesses it using KVM. In this case, the secure box or room may serve the function of the physical lock 350 or the permanently attaching of BRL unit 310 to PC 330.

Optionally BRL unit 310' communicates with PC 330 via authentication and reporting link 239 as depicted in FIG. 2. Link 239 may be a dedicated link or a standard PC link such as USB.

In the depicted embodiment, user's key reader 237 on remote controlling unit 392, however, user's key reader 237 may be located on casing 314, or missing.

FIG. 4A schematically depicts a computer system 400 with secure audio channels using an internal BRL circuit 410 according to another exemplary of the current invention.

In this exemplary embodiment PC 430 having enclosure 439 comprises an internal BRL circuit 410. Internal BRL circuit 410, which performs similar functions to BRL unit 310 of FIG. 3A, may be an integral part of PC 430, or an add on, located within one of the extension slots, or bays inside the enclosure 439 such that its output audio jack 442 and audio input jack 421 are accessible outside the enclosure 439. In this embodiment, internal BRL circuit 410 comprise two side by side BRL channels 100, connected to the PC's original audio output 332' and original audio input 331'.

Optionally, internal BRL circuit 410 may be integrated into the motherboard of PC 430. It should be noted that preferably the non-secure audio jacks of PC 430 are removed or disabled.

Figure 4B:
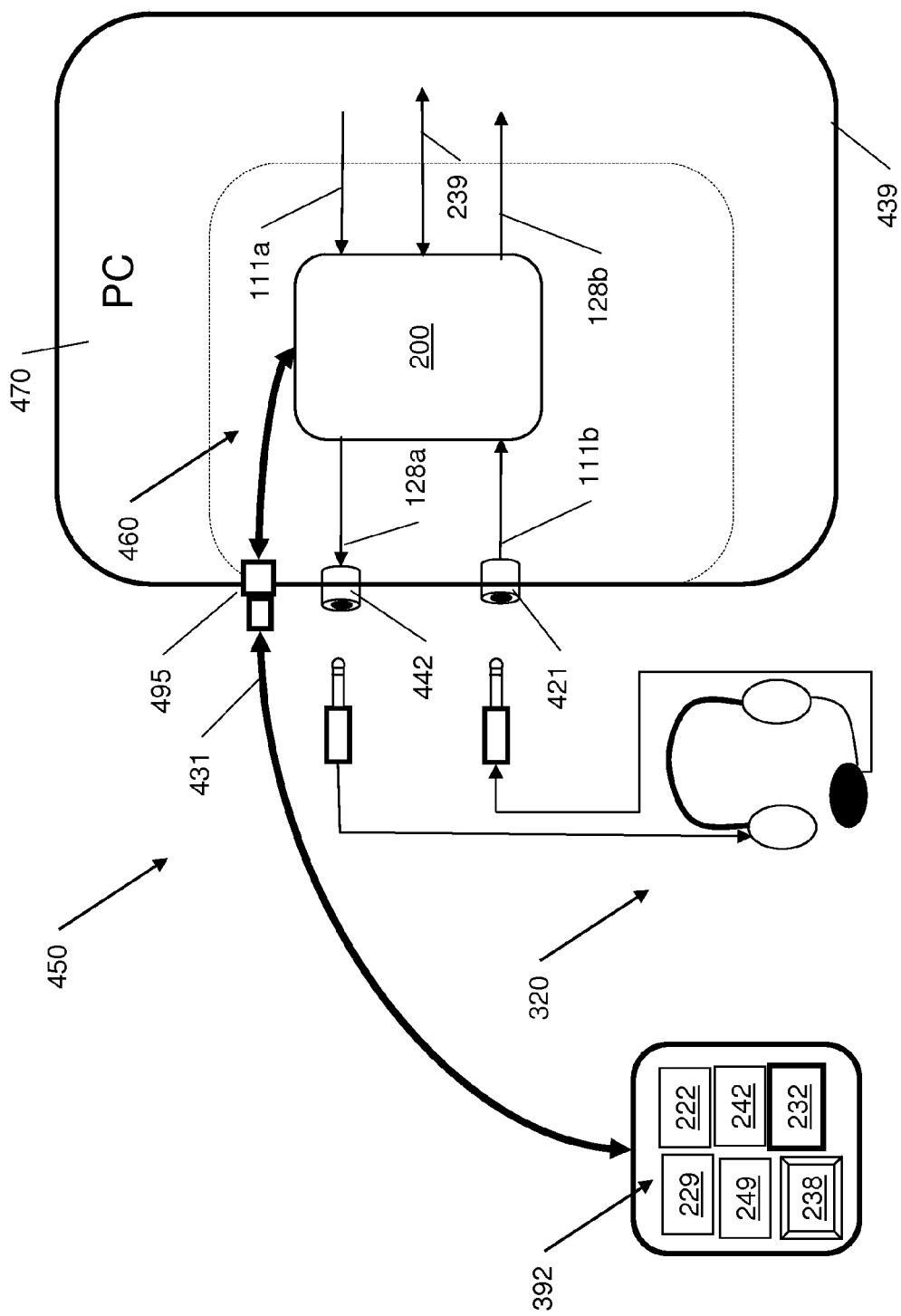
FIG. 4B schematically depicts a computer system with secure audio channels using an internal BRL circuit according to another exemplary of the current invention.

FIG. 4B schematically depicts a computer system 450 with secure audio channels using an internal BRL circuit 460 according to another exemplary of the current invention.

In this exemplary embodiment PC 470 having enclosure 439 comprises an internal BRL circuit 460. Internal BRL circuit 460, which performs similar function as BRL unit 310' of FIG. 3B, may be an add on, located within one of the extension slots or bays inside the enclosure 439 such that its output jack 442 and input jack 421 are accessible outside the enclosure 439. In this embodiment, internal BRL circuit 460 comprise BRL circuitry 200, connected to the PC's original audio output 332' and original audio input 331'.

Optionally, internal BRL circuit 460 may be integrated into the motherboard of PC 430. Optionally, internal BRL circuit 460 may be integrated into a sound card or a video and sound card used in the PC.

Remote controlling unit 392 is optionally connected to the PC via connector 495 and cord 431. Optionally, authentication function 238 is missing from controlling unit 392, such that cord 431 includes only signaling lines and thus connector 495 cannot be used for an attack on the PC 470. Controlling unit 392 is optionally attached to, or integrated into headset 320. In this case, connectors 495, 421 and 421 may be integrated to a single multi-pins connector. It should be noted that preferably the non-secure audio jacks of PC 430 are removed or disabled. Optionally, functions such as voice ON or music ON may be activated by keystrokes of mouse clicks.

Figure 4C:
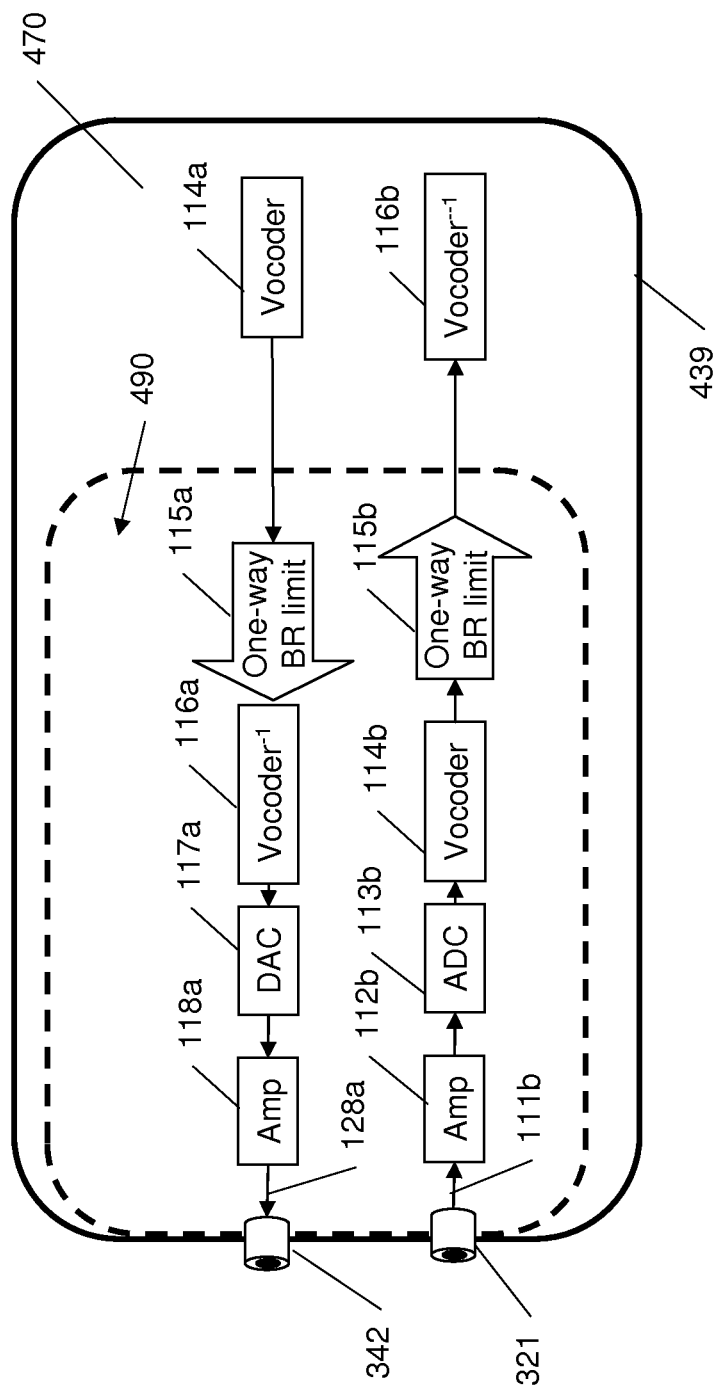
FIG. 4C schematically depicts a variation of computer system with secure audio channels using an internal reduced cost BRL circuit according to another exemplary of the current invention.

FIG. 4C schematically depicts a variation of computer system 450 with secure audio channels using an internal reduced cost BRL circuit 490 according to another exemplary of the current invention.

In order to save components and cost of the reduced cost BRL circuit 490, the functions beyond the BR 115a and BR 115b, that is the functionality of coding vocoder 114a and decoding vocoder 116b may be performed by the PC processor, while reduced cost BRL circuit 490 comprises only: BR 115a, decoding vocoder 116a, DAC 117a and amplifier 118a in the output channel, and amplifier 112b, ADC 113b, coding vocoder 114b and BR 115b in the input channel.

Optionally, reduced cost BRL circuit 490 further comprises other components and functions of BRL circuitry 200 seen in FIGS. 2, 3B and/or 4B.

Figure 5A:
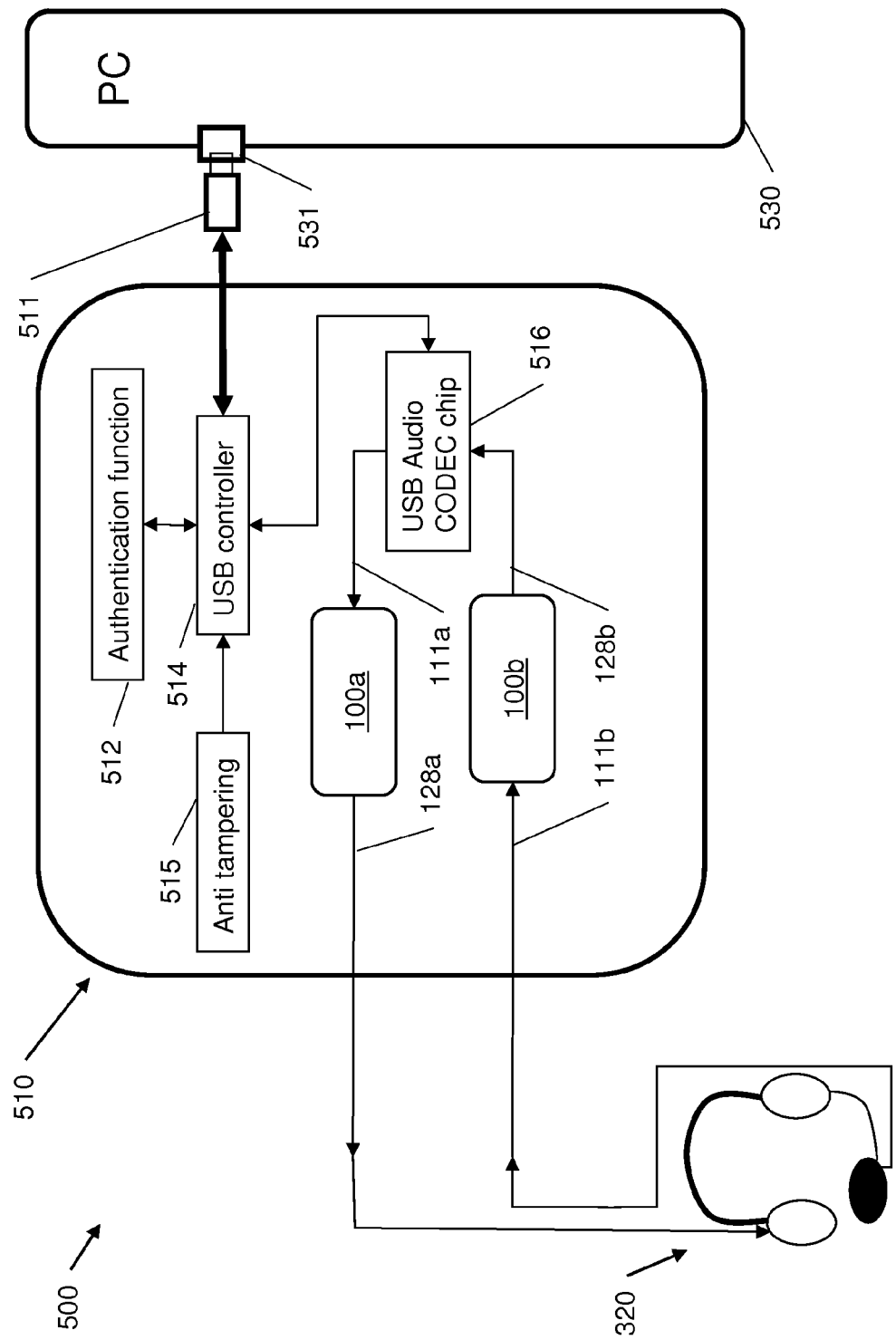
FIG. 5A schematically depicts a computer system with secure USB audio channels according to another exemplary of the current invention.

FIG. 5A schematically depicts a computer system 500 with secure USB audio channels according to another exemplary of the current invention.

It should be noted that unprotected USB port poses a great security risk due to its high speed data transfer rates capabilities. System 500 comprises a PC 530 having at least one USB port 531. Secure USB audio peripheral device 510 is connected to the USB port 531 by USB plug 511. USB audio peripheral device 510 comprises a USB controller 514 that interfaces with the PC and an authentication function 512 capable of enumeration in front of PC 530 and enabling audio data exchange. A security procedure within PC 530 is used to defeat attempts to insert an unauthorized device to USB port 531. Optionally secure USB audio peripheral device 510 comprises anti tampering function 515 such as disclosed above (e.g. 230 and 231 of FIG. 2).

Audio data from PC 530 is decoded by CODEC 516, for example a USB CODEC chip and appears as analog audio signal 111a at the input of output BRL channel 100a. Analog voice signal 128a from output BRL channel 100a is sent to earphones of headset 320. Similarly, analog audio signal 111b from the microphone of headset 320 passes through input BRL 100b, is coded by CODEC 516 and passes to PC 530 via USB controller 514 and USB port 531.

Optionally, headset 320 is replaced with a microphone and speaker. Optionally, headset 320 interfaces with secure USB audio peripheral device 510 via audio plugs and jacks as seen for example in FIG. 3A.

Figure 5B:
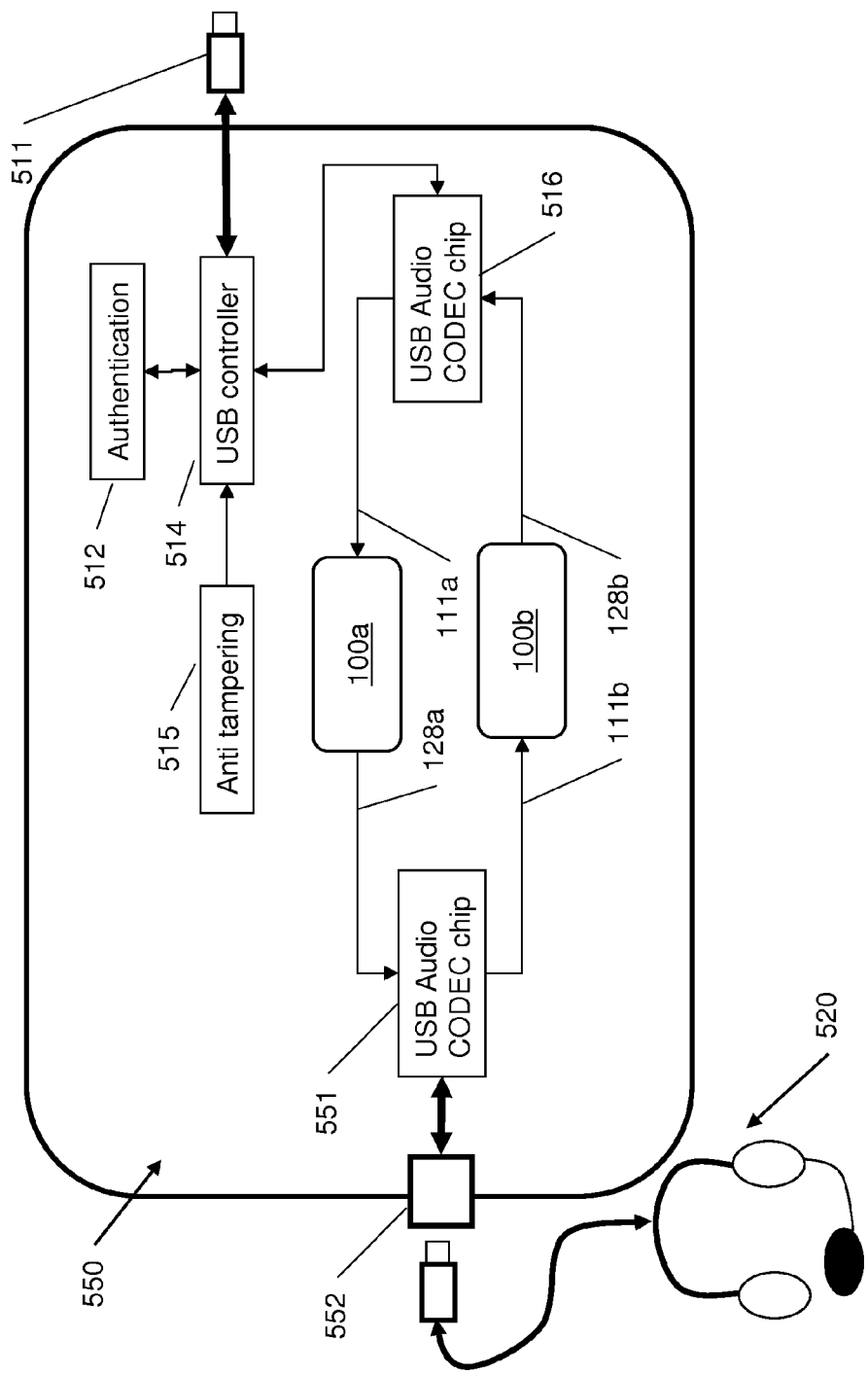
FIG. 5B schematically depicts a secure USB audio peripheral device to be used with a USB headset according to another exemplary of the current invention.

FIG. 5B schematically depicts a secure USB audio peripheral device 550 to be used with a USB headset 520 according to another exemplary of the current invention.

In contrast to secure USB audio peripheral device 510 of FIG. 5A, secure USB audio peripheral device 550 comprises a second USB port 552 for interfacing with a standard USB headset 520. Voice signal 128a from output BRL channel 100a is coded by USB CODEC chip 551 and is directed to the earphones in USB headset 520. Similarly, audio data from the microphone in USB headset 520 is decoded by USB CODEC chip 551 and appears as input audio signal 11b on input BRL channel 100b.

FIG. 5C schematically depicts a secure USB audio peripheral device 590 having the functionality of BRL circuitry 200 seen in FIGS. 2, 3B and 4B according to an exemplary embodiment of the current invention.

In this exemplary embodiment, BRL channels 100a and 100b seen in FIG. 5A were replaced with BRL circuitry 200. An analog headset 320 is connected via jacks 442 and 421, and controlling unit 392 is connected via cord 431 and optional connector 495.

In this embodiment, controlling unit 392 is missing the user's authentication function 238, and circuit 200 is missing reporting link 239 to reduce vulnerability of the system to attacks via connector 495.

In embodiments depicted in FIGS. 5A-C, the PC 530 is protected against attacks via USB port 531 by the use of authentication function 512. However, optionally, a physical lock such as physical lock 530 seen in FIGS. 3A-B may be used to prevent insertion of unauthorized USB device to USB port 531. Alternatively, the PC and the USB BRL devices 510, 550, or 590 may be placed in a locked security box or a secured room with only the headset, remote unit, and cords accessible to the user.

Figure 6A:
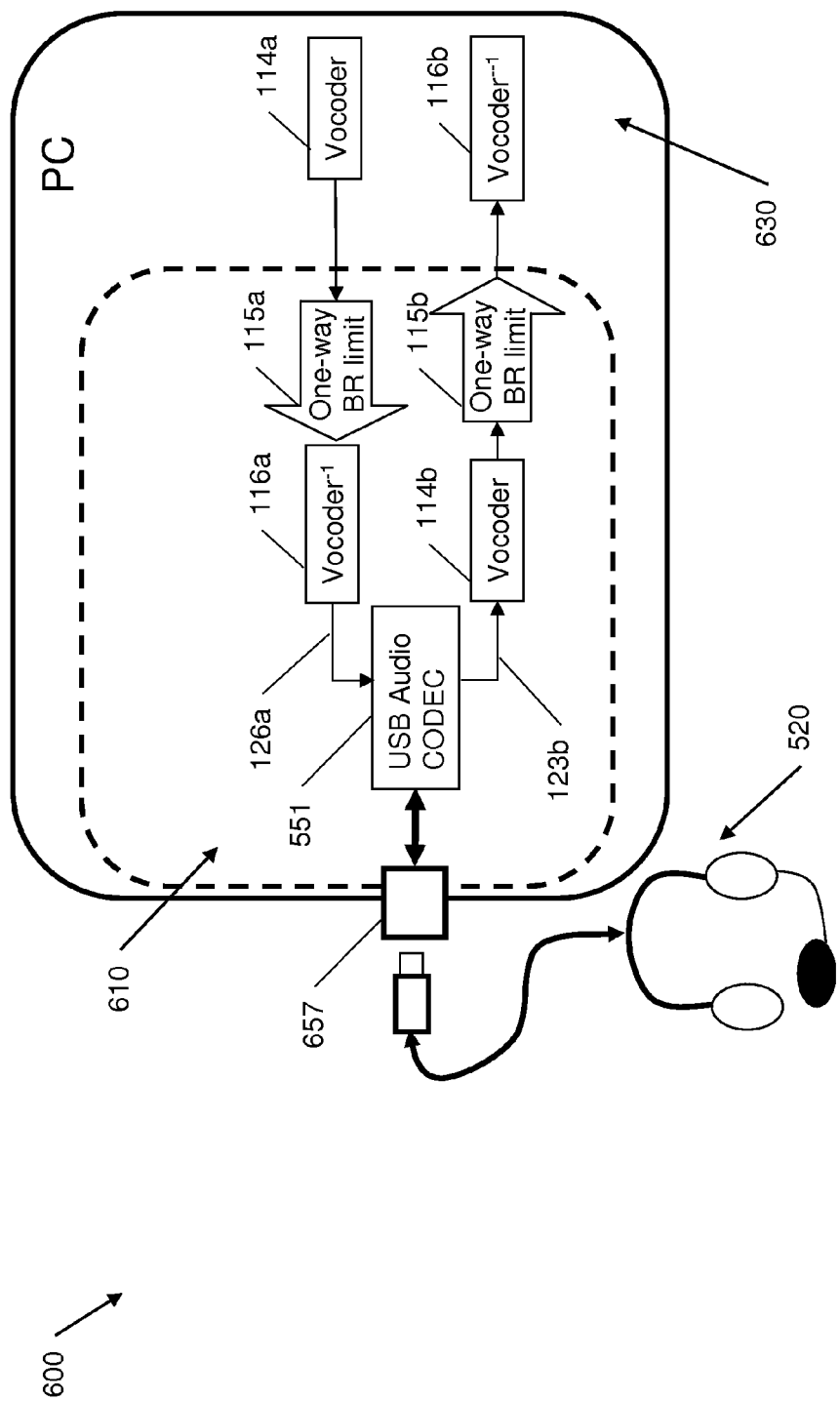
FIG. 6A schematically depicts a computer system with secure audio USB port, using an internal USB BRL circuit, to be used with USB headset according to another exemplary of the current invention.

FIG. 6A schematically depicts a computer system 600 with secure audio USB port 657 using an internal USB BRL circuit 610, to be used with USB headset 520 according to another exemplary of the current invention.

Similarly to the embodiment depicted in FIG. 4C, in this exemplary embodiment, parts of the audio tasks, such as output coding vocoder 114a and input decoding vocoder 116b, may optionally be performed by the processor of PC 630. A dedicated internal USB BRL circuit 610 comprises output BR 115a and input BR 115b, and coding vocoder 114a and decoding vocoder 116b.

Audio output information from PC 630 is coded by coding vocoder 114a. After passing through the optional BR 115a, the information is decoded by decoding vocoder 116a to voice-only digital data 126a. This data is coded by USB audio CODEC 551 and is available to a conventional USB headset 520 via USB port 657.

Similarly, Audio input signals from USB headset 520 arrives at USB CODEC 551 via USB port 657 and decoded. The input audio bit-stream 123b is coded by coding vocoder 114a. After passing through the optional BR 115b, the audio input information is decoded by decoding vocoder 116b to voice-only digital data and is available to PC 630.

Figure 6B:
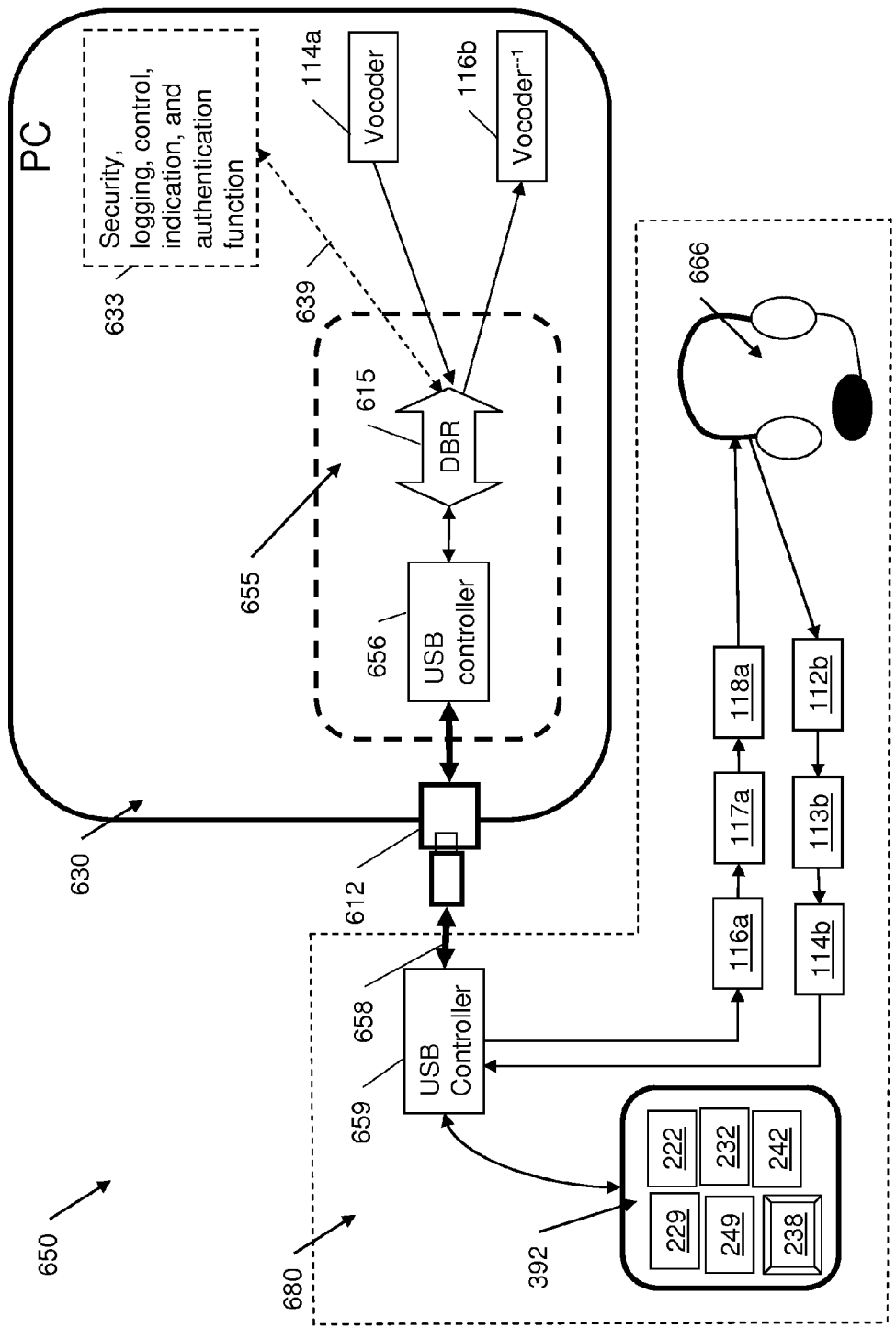
FIG. 6B schematically depicts a computer system with secure audio USB port using an internal USB BRL circuit, to be used with modified USB headset and optional controlling unit according to another exemplary of the current invention.

FIG. 6B schematically depicts a computer system 650 with secure audio USB port 612 using an internal USB BRL circuit 655, to be used with modified USB headset 680 and optional controlling unit 392 according to another exemplary of the current invention.

In this exemplary embodiment, the USB port 612 is made to be a very slow USB port, capable of supporting bit-rates high enough only to transfer voice that was coded by efficient vocoders. Preferably this is done in a way that is impossible or at least extremely difficult to defeat, for example by inserting a Duplex Bit Rate limiter DBR 615 between the USB controller 656 and the standard circuitry of PC 630. Optionally, USB controller 656 comprises small size buffer memory so it can accept a short burst of data received from USB connector 659, and transfer the data at the low rate compatible with DBR 615. Optionally, any standard USB peripheral inserted into USB connector 612 will behave normally, as long as the data rate it attempt to receive from or transmit to PC 630 do not exceed the maximum rate allowed by DBR 615. Optionally DBR 615 may not be symmetric and may allow higher rate in one direction than the other. Optionally, DBR 615 is programmable within specific ranges. For example DBR 615 may be programmed for output voice communication from the PC at rate of 1,200 bps, but allow only authentication and fault messages to be received from the USB audio peripheral at average rate of 50 bps, in bursts of up to 1,000 bits. In another example, USB port 612 may be used in for a standard keyboard and/or mouse by setting the DBR rates accordingly.

In some embodiments, USB controller 656 is a standard USB controller, and the entire modification, including the optional buffers are implemented in the DBR 615. Optionally, DBR 615 is a hardware elements that cannot be re-programmed, or can be re-programmed only within a limited range of data rates, and/or can be reprogrammed only using authorized device or is protected by password.

Secure USB audio peripheral 680 is connected to the very slow USB port 612.

In the exemplary embodiment, audio output is coded to low bit-rate data by coding vocoder 114a in PC 630. The low rate voice data passes through DBR 615 and via USB controller 656, USB connector 612 and cord 658 to USB slave controller 659 where it is detected and sent to decoding vocoder 116a to be decoded and heard in earphones of headset 666.

Similarly, audio signals from the microphone in headset 666 are coded by coding vocoder 114b, passes through slave USB controller 659, and via optional cord 658 to USB controller 656, DRB 615 to be decoded in input decoding vocoder 116b.

Optionally, to allow some or all of: authentication of secure USB audio peripheral 680; authentication of the user; controlling the operation of secure USB headset 680 such as providing timed operation; use logging; and fault reporting, secure USB audio peripheral 680 further comprises a controlling unit 392. Controlling unit 392 may locally control the operation of secure USB audio peripheral 680, for example local authentication of the user by authentication function such as card or key reader 238, and/or by timing or muting the microphone and/or the earphones.

Additionally, alternatively and optionally, security and log function (seen in FIG. 2) may interact with security function 633 in PC 630 via USB slave controller 659, USB controller 656, DBR 615 and link 639 at low bit-rate allowed by the DBR. Link 639, may perform the same functions of link 239 of FIG. 2. Additionally and optionally, link 639 may be used for controlling the parameters of coding vocoder 114a and decoding vocoder 116b to control the audio quality.

Figure 7A:
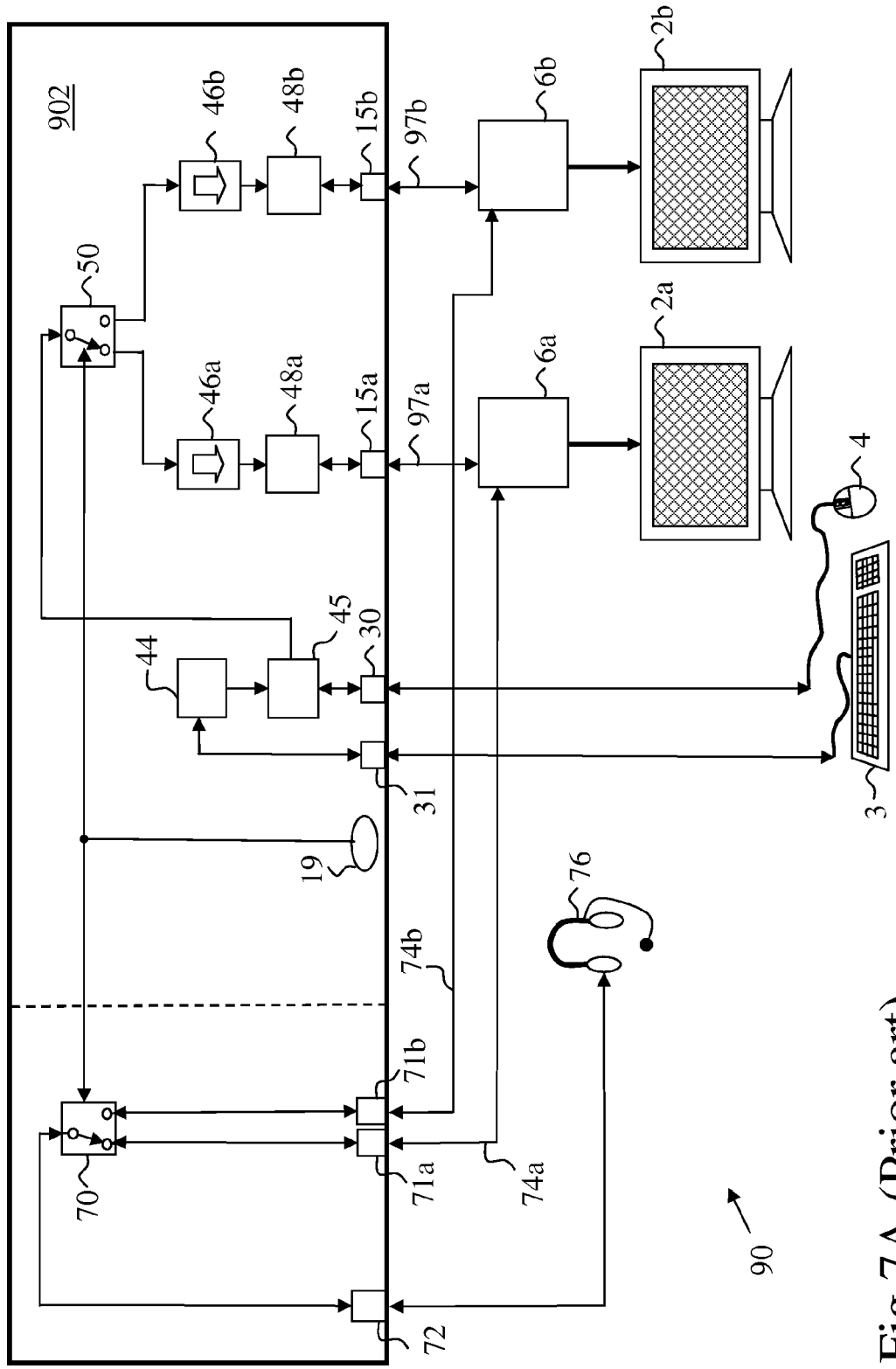
FIG. 7A, which was adopted from FIG. 10 of PCT application WO2012095852 shows the vulnerability of KM switch of the prior art to data leaks via the audio channels.
Figure 10:
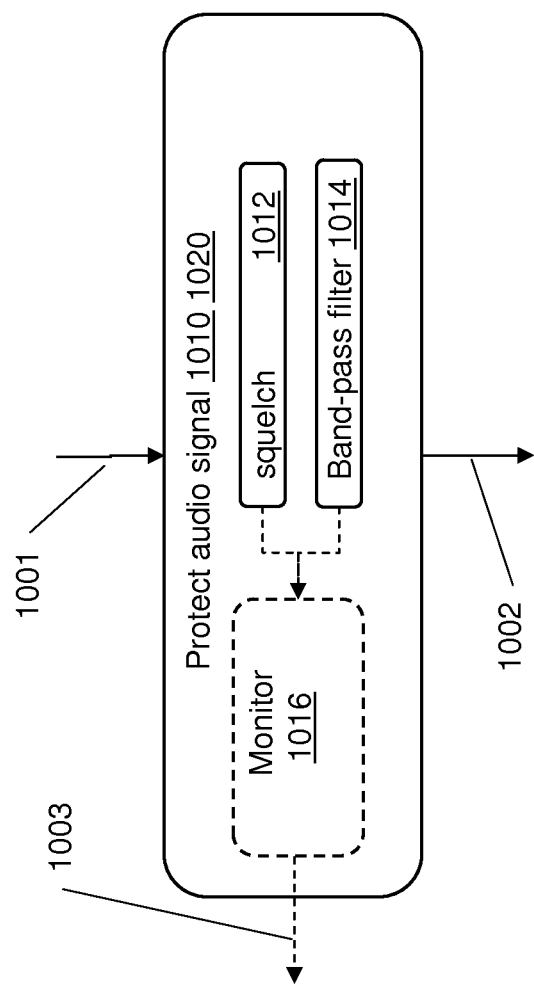
FIG. 10 schematically depicts a filter used for securing an audio channel according to yet another embodiment of the current invention.

FIG. 7A, which was adopted from FIG. 10 of PCT application WO2012095852 shows the vulnerability of a KM switch of the prior art to data leaks via the audio channels.

For drawing simplicity, and text brevity some elements and functions were omitted from this and the next drawing and associated text.

PCT application WO2012095852; to Soffer Aviv; titled secure KM switch, which is incorporated herein by reference, provides a system 90 enabling a computer user to securely share a single set of keyboard 3, mouse 4 among multiple isolated computers 6a and 6b, each having a display 2a and 2b respectively. The system enables one set of peripheral devices to independently interact with multiple coupled isolated computers for example through mouse position analysis on a virtual display area corresponding to multiple physical user displays of the particular installation. The system may be used to enable computer user having multiple isolated computers each with one or more coupled display to automatically switch a single set of keyboard mouse and other peripheral devices between the different computers which may have different security levels.

User keyboard 3 and mouse 4 are connected to the KM 902 through a USB or a PS/2 user keyboard port 31 and user mouse port 30. The keyboard host emulator 44 unidirectional serial output is routed into the mouse host emulator 45 where it is combined together with the mouse unidirectional serial output into a single serial data stream routed through channel select switch 50 into one of the device emulators 48a and 48b after passing through a corresponding unidirectional flow forcing circuitry 46a and 46b. These device emulators serves as a composite device having one keyboard and one mouse device and it is coupled to the one of the host computers 6a and 6b, selected by channel select switch 50 through host peripheral ports 15a to 15b and host peripheral cables 97a to 97b respectively. User can select between computers 6a and 6b by pressing channel toggle push button 19 which controls both channel select switch 50 and audio switch 70.

The audio switching was added to the Secure KM switch 902 in order to enable user to operate audio peripherals such as earphones, microphone, headset 76 or speakers connected to the KM switch 902 via audio jack 72. Computers 6a and 6b having audio cables 74a and 74b connected to the Secure KM switch 902 audio interfaces (input, output, or input/output) ports 71a and 71b respectively. Cables 74x may couple audio out, audio in, microphone or other digital or analog audio signal. Audio switch 70 may be implemented by a simple relay or analog switch to enable audio channel on-off switching.

It is easy to see that when switch 70 connects headset 76 to computer 6a, large amount of data may be downloaded from computer 6a to a storage device hidden in headset 76 using the high data rate available in the audio channel. This data may be transferred later to a mobile storage device and be sent to the attacker location. Alternatively, the stored data may be uploaded to computer 6b, which may be connected to unsecured network such as the Internet, when switch 70 connects computer 6b to headset 76.

Figure 7B:
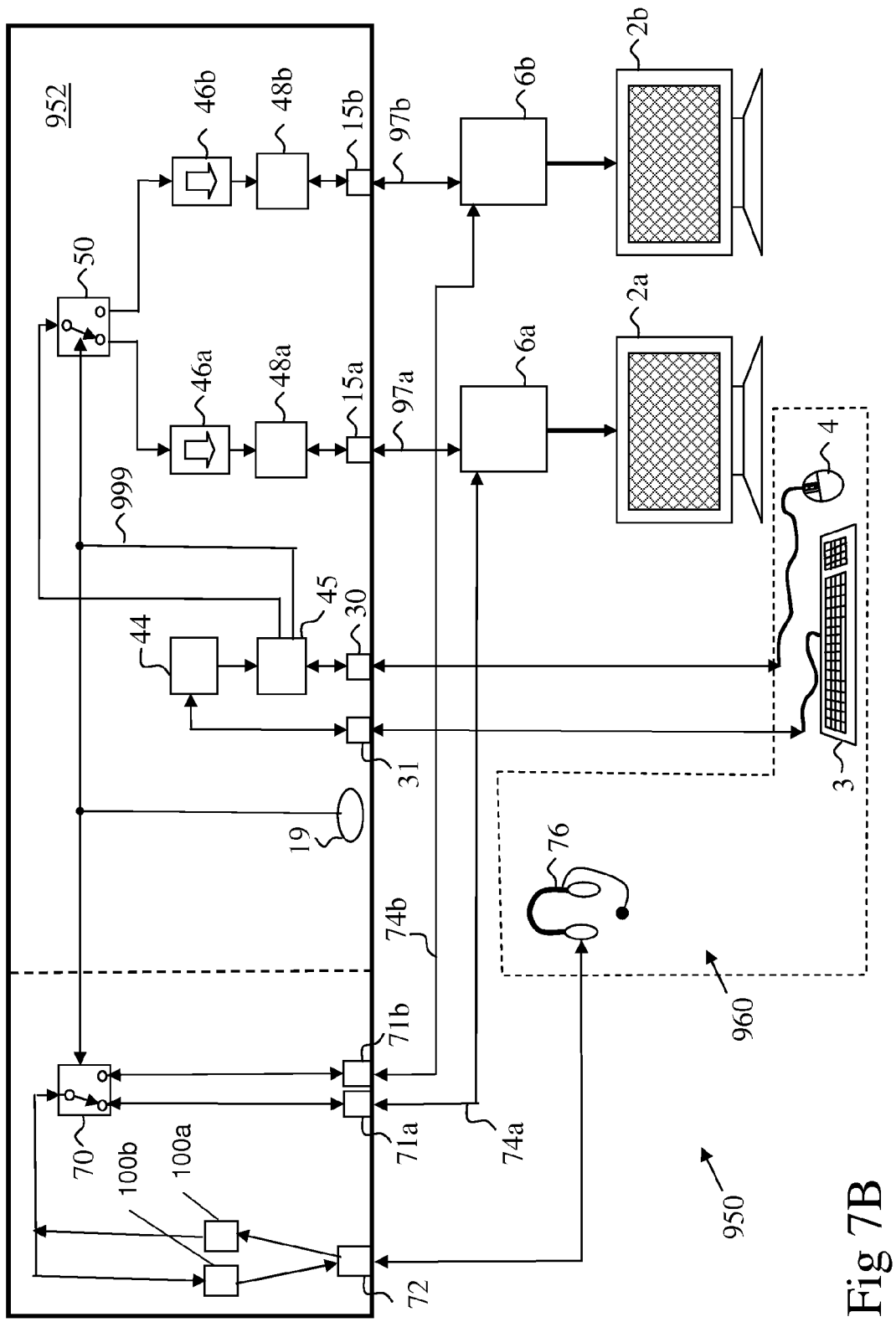
FIG. 7B schematically depicts a computer system using KM switch with secure audio channel according to an exemplary embodiment of the current invention.

FIG. 7B schematically depicts a computer system 590 using KM switch 952 with secure audio channel according to an exemplary embodiment of the current invention.

In this exemplary embodiment, a pair of side by side BRL channels 100a and 100b are used to secure the audio channel.

Optionally, functionality depicted in the previous figures may be added to KM 902 by adding elements of BRL circuitry 200 to the KM switch 902. Control of the audio channel may optionally be done by one or few of: adding switches 229 and/or 242 to the KM 902, by adding a controlling unit 392; by analyzing the keystrokes of keyboard 3 for control keys or key combinations, and/or by using the mouse point and click.

Controlling keystrokes or mouse point and clicks may be detected by mouse host emulator 45 and used for driving switches 50 and 70 via optional line 999. In this case, the user may be restricted to user's station 960, with a view to display 2a and 2b, with access to keyboard 3, mouse 4 and headset 76, but without physical access to any critical components of system 950.

Alternatively or additionally, devices such as depicted herein may be installed at audio interfaces 71a and 71b, or at computers 6a and 6b, or along the audio channels such as audio cables 74a and 74b, or at headset 76. It should be noted that the specific embodiment of FIG. 7B was presented for demonstration of securing audio channels in computer system having a plurality of host computers. The invention may be used with, added to or integrated within other KM or KVM systems not shown here for brevity. Embodiments seen in one of the previous figures may also be used with KM or KVM systems. Alternatively, each of the host computers 6x may be separately protected. For example, audio ports of host computers 6x may be protected as seen in one of the previous figures, or a pair of side by side BRL channels 100a and 100b may be inserted in line with each of audio cables 74a and 74b. It should be noted that at least one of hosts 6x may have lower security level, and may be connected to a network with lower security, such as the Internet, and thus data leak from the more secure host to the less secure host may result in security breach. Moreover, data security may need to be maintained even when facing of one or few of the following: the computer 330, or one or both hosts 6x were infected with malicious codes, the computer peripherals were tampered with, and even when the user is actively trying to cause data leak.

Figure 8A:
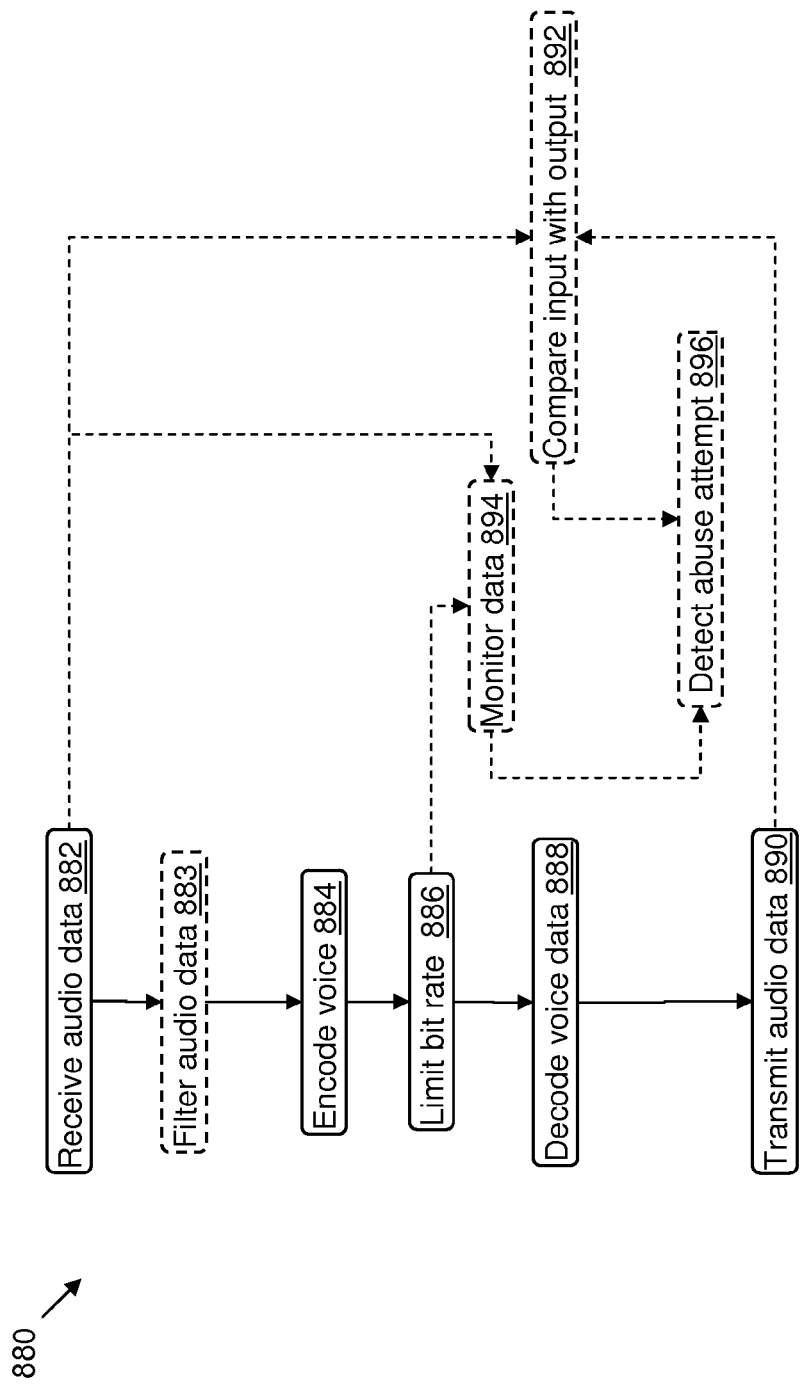
FIG. 8A illustrates a high-level flow chart of a method for providing security for the voice channel according to an exemplary embodiment of the current invention.

FIG. 8A illustrates a high-level flow chart of a method for providing security for the voice channel according to an exemplary embodiment of the current invention.

Audio data is received 882 in digital or analog or digital form. The human-voice component is encoded 884 to a low bit-rate digital data stream. Bit rate is limited 886 to below a predefined rate as part of the encoding 884, or in a bit-rate limiter. The low bit-rate digital data stream is decoded 888 to voice data in digital or analog form that is transmitted 890 to the destination of the audio data.

Optionally the audio data is filtered. For example, low volume signals which may be below human perception may be filtered out. This type of filtering is sometimes called "squelch". Additionally, optionally or alternatively, frequencies outside the human voice may be filtered out.

Optionally, the data is monitored 894 to detect attempts to abuse the audio channel. For example, the presence of frequencies outside the human voice at the received audio data may be detected. For example, the data rate of the encoded voice is monitored to ensure that it is below the preset value. For example, voice recognition may be applied to the encoded voice to ensure that there was no attempt to transfer non-human voice. Voice recognition may optionally be applied at random sampling times, and may be required to recognize only at least some fraction of the words in the voice data.

Optionally, by comparing 892 the received audio data to the transmitted audio data attempt to transmit non-human voice may be detected.

When attempt to abuse the audio channel is detected 896, a corrective action may be initiated. A corrective action may be one or few of:
a) Alert message sent to the user or to administrator.
b) Stopping the abusing data transmission.
c) Stopping all data transmission until the system is reset by authorized agent.
d) Stopping all data transmission for a preset duration.
e) Permanent disabling (self destruction) of the audio channel or the audio device.

Figure 8B:
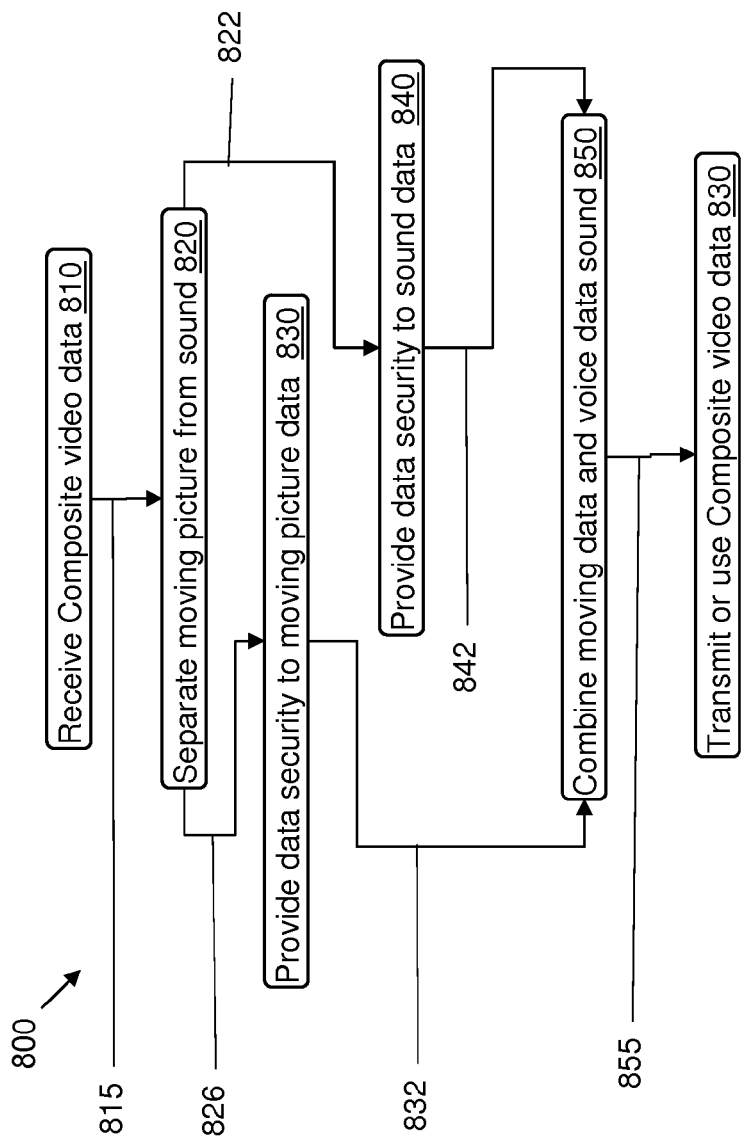
FIG. 8B illustrates a high-level flow chart of a method for providing security for the voice channel associated with video streaming according to an exemplary embodiment of the current invention.

FIG. 8B illustrates a high-level flow chart 800 of a method for providing security for the voice channel associated with video streaming according to another exemplary embodiment of the current invention. It is another general aspect of exemplary embodiments of the current invention to reduce security risk associated with audio channels associated with video streaming. While measures, for example as known in the art, have been taken to eliminate or minimize data leaks via the moving pictures in the video, the current exemplary embodiment of the invention provides security to the audio channels of that video. This is done by:

Receiving 810 a composite video data 815. The composite video data 815 may be in analog, digital or in packets format.

Separating 820 the audio data stream 822 from the moving picture data 826 data.

Treating 830 the moving picture data 826 separately.

Concurrently providing security 840 to the audio data stream 822, for example using BRL 100 or BRL circuitry 200 or the method depicted in FIG. 8 above or 9 below, to create secure voice-only data stream 842.

Combining 850 the secure voice-only data stream 842 with the separately treated moving picture data 832 to a secure combined video data 855.

Transmitting or using 830 the secure combined video data 855.

In some embodiments, wherein the method 800 is used at the point of generation of the video stream, for example at the video camera system, for example a web-cam or a video conferencing transmission unit, the step of separating the video data may not be needed, and the audio channel is treated before it is combined with the moving picture data.

In some embodiments, wherein the method 800 is used at the point of viewing the video images and listening to the audio associated with the video, for example at the video conferencing viewing system or monitoring system, the step of combining 850 the video data with the audio data may not be needed, and the audio channel is treated before it is connected to the listening device such as a headset or speaker.

A unit executing the method 800 may be implemented within a firewall unit, at the end point computer, or as a dedicated video streaming securing unit.

Figure 9:
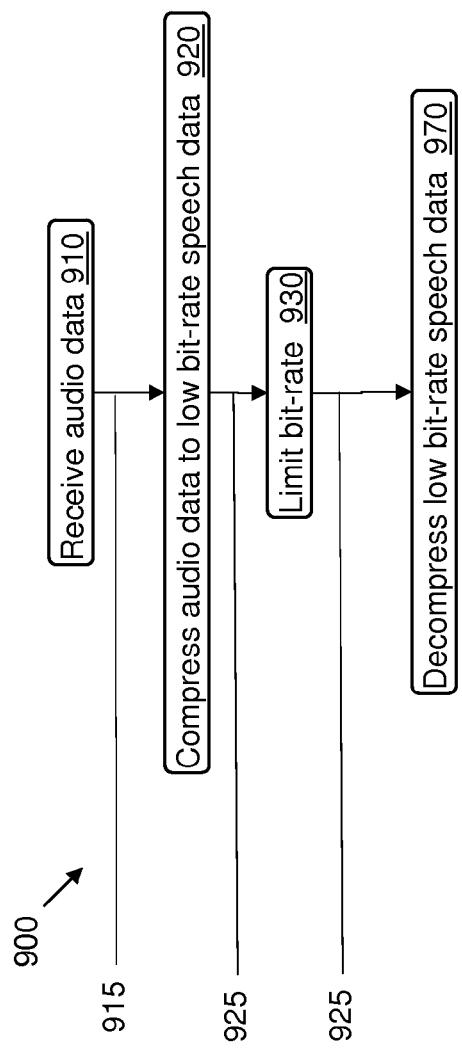
FIG. 9 illustrates a high-level flow chart 900 of a method for providing security for the voice channel according to yet another exemplary embodiment of the current invention.

FIG. 9 illustrates a high-level flow chart 900 of a method for providing security for the voice channel according to another exemplary embodiment of the current invention.

The method 900 comprises:

Receiving 910 audio data 915. Audio data 915 may be in analog, digital or in packets format.

Compressing 920 with a coding vocoder the audio data 915 to low bit-rate digital information 925 substantially indicative only of human speech content in the original audio data 915.

Ensuring 930 that the low bit-rate digital information 925 does not exceed the low bit-rate actually needed for transmission of the speech content.

Decompressing 970 the low bit-rate digital information back to standard audio signal with a decoding vocoder.

Methods 900 and 880 appear to be similar to the method used in conventional digital voice transmission, for example as used in modern cellular phones or VoIP telephony. However, in contrast to the methods of the art, methods 900 and 880 specifically include bit-rate limitations 930 and 886. In conventional communication system, the bit rate is limited to save communication bandwidth for cost reduction and not for security reasons. Thus, when the audio content require higher bit rate (such as when music is present) the bit rate is automatically increases. Additionally, encoding 920 (882) and decoding 970 (888) are performed at two opposing ends of a communication channel which generally situated at different physical locations and different end user devices. In contrast, in methods 900 and 880, the entire method may be performed at the same location or within the same device, while the long communication channel is before the data receiving 910 (882) or after the data decoding 970 or data transmission 890.

Securing an audio channel may optionally be done without using an encoding vocoder and a decoding vocoder pair. Instead, a filter or a combination of filters may be used. For example, a band-pass filter, designed to pass only frequencies used in human speech may limit the band-width available for data transmission over the audio channel. Such band-pass filter may be set, for example, to transmit frequencies between 300 and 3,400 Hz and still allows reasonable voice quality of the speech. Other frequency ranges may be used. Optionally an adaptive filter may be used that adapts to the specific person currently speaking, and has some latency based on the assumption that one person is speaking at the time, and each speaker speaks for at least a minimal duration. Adapting to the characteristics of the voice of the person currently speaking may allow further reduction of the allowed frequency range, thus further reducing the bandwidth available for non-speech data transmission.

Frequency filtering may optionally be used for monitoring purposes. By monitoring the rejected signals, that is, the components of the signal outside the allowed frequency range, attempt to transmit non-human voice may be detected. Statistical study of the variations in volume and frequency may also distinguish between human voice and non-human voice.

Low volume signals may be rejected by using squelch filtering as was discussed above. Squelch filtering may also optionally be used for monitoring purposes. By monitoring the rejected signals, that is, the components of the signal below the threshold volume, attempts to transmit non-human voice may be detected.

Securing an audio channel by filtering may be done on analog signals, using analog filtering electronics. Alternatively, filtering may be done on digital data representing the audio signal. Such filtering may be performed in time domain, or at the frequency domain after the audio signal is converted to its frequency spectra, for example using FFT algorithms and the likes.

Accordingly, a man skilled in the art of electronics and signal processing may easily replace the chain of encoding vocoder, bit-rate limiter and decoding vocoder with a band-pass filter, optionally together with a squelch filter. Similarly, the monitoring function seen in FIG. 2 and FIG. 8A may be performed by monitoring the rejected signals as depicted above, Mute option is easy to implement, and "music ON" option is implemented by removing the band-pass filter or increasing its frequency range.

Signal filtering may thus replace the chain of encoding vocoder, bit-rate limiter and decoding vocoder in at least some of the embodiments seen in FIGS. 1 to 6 and 7B to 9.

Filtering audio signal may be performed with very low power consumption. For example, band-pass filtering of analog signals may be performed using passive electronics such as coils, capacitors and resistors. Squelch filtering may be performed with non-linear components such as diodes. Active components such as Op-Amps may allow greater flexibility and better performance of the filter at low cost, complexity and power consumption. Similarly, digital filtering may require lower computation power and lower power consumption than a pair of vocoders.

FIG. 10 schematically depicts a filter used for securing an audio channel according to yet another embodiment of the current invention, Raw signal 1001 enters the filter 1010 where it undertows at least bad-pass filtering in band-pass filter 1012, and optionally also squelch filtering 1014 and exit as secure audio signal 1002. Optionally monitoring function 1016 provides abuse alert signal 1003 to be used with an optional security function such as seen in FIGS. 2, 6B and 8A. It should be noted that other filters may be applied within the protect audio signal 1010 step when used in a method, or a protect audio signal hardware unit 1020 in a device or system. Order of applying the various filter may be altered or changed.

In all the above embodiments, USB connectors, cables, chips, electronics and protocols were given as an example only. Other digital communication protocols, commercially available or yet to be adopted may be used instead.

As used herein, the term "computer", processor or "module" may include any processor-based or microprocessor-based system including systems using microcontrollers, reduced instruction set computers (RISC), application specific integrated circuits (ASICs), logic circuits, and any other circuit or processor capable of executing the functions described herein. The above examples are exemplary only, and are thus not intended to limit in any way the definition and/or meaning of the term "computer".

The computer or processor executes a set of instructions that are stored in one or more storage elements, in order to process input data. The storage elements may also store data or other information as desired or needed. The storage element may be in the form of an information source or a physical memory element within a processing machine.

The set of instructions may include various commands that instruct the computer or processor as a processing machine to perform specific operations such as the methods and processes of the various embodiments of the invention. The set of instructions may be in the form of a software program. The software may be in various forms such as system software or application software. Further, the software may be in the form of a collection of separate programs or modules, a program module within a larger program or a portion of a program module. The software also may include modular programming in the form of object-oriented programming. The processing of input data by the processing machine may be in response to operator commands, or in response to results of previous processing, or in response to a request made by another processing machine.

As used herein, the terms "software" and "firmware" are interchangeable, and include any computer program stored in memory for execution by a computer, including RAM memory, ROM memory, EPROM memory, EEPROM memory, and non-volatile RAM (NVRAM) memory. The above memory types are exemplary only, and are thus not limiting as to the types of memory usable for storage of a computer program.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments of the invention without departing from their scope. While the dimensions and types of materials described herein are intended to define the parameters of the various embodiments of the invention, the embodiments are by no means limiting and are exemplary embodiments. Many other embodiments will be apparent to those of skill in the art upon reviewing the above description. The scope of the various embodiments of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects.

Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

This written description uses examples to disclose the various embodiments of the invention, including the best mode, and also to enable any person skilled in the art to practice the various embodiments of the invention, including making and using any devices or systems and performing any incorporated methods. The patentable scope of the various embodiments of the invention is defined by the claims, and may include other examples that occur to those skilled in the art. Such other examples are intended to be within the scope of the claims if the examples have structural elements that do not differ from the literal language of the claims, or if the examples include equivalent structural elements with insubstantial differences from the literal languages of the claims.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims. All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention.

In this document the term "function" or other references to "function" or "functions" may generally refer to hardware capable of performing the stated function. The hardware may comprise one or a plurality of electronic circuitries. The hardware may be based on an ASIC (Application Specific Integrated Circuit), a processor accompanied with the necessary memory, a programmable device such as FPGA (Field Programmable Gate Array), or other device or devices capable of performing the desired function. The block diagrams seen here may refer to the function (rather then the hardware sub-units) since modern electronic hardware are capable of performing several functions. Thus, a plurality of functions may be performed by the same hardware. Alternatively, each function may be performed by a dedicated hardware, for example a single chip, or several chips. A man skilled in the art of electronics may find several ways to realize and implement the "function" or "functions". All such implementations are within the scope of this invention.

The invention claimed is:

1. An audio security device for a computer system comprising:
   an outgoing coding vocoder, for receiving outgoing audio signal from audio output channel of a computer, and compressing said outgoing audio signal to an outgoing low bit-rate digital data indicative of human speech included in said outgoing audio signal;
   an outgoing decoding vocoder located within an enclosure with said outgoing coding vocoder, and coupled to said outgoing coding vocoder for receiving said outgoing low bit-rate digital data generated by said outgoing coding vocoder, and decompressing said low bit-rate digital data to a secure outgoing audio signal, wherein a maximum bit-rate of said outgoing low bit-rate digital data is intentionally limited to bit rate sufficient for transmitting compressed human speech, wherein said secure outgoing audio signal reproduces only said human speech included in said outgoing audio signal when the audio security device is operated in a secure mode; and further comprising:
   a music ON switch;
   a music bypass timer, wherein said music bypass timer is activated by said music ON switch;
   a music ON indicator; and
   a music bypass switch,
   wherein said music bypass switch and said music ON indicator are activated by said music timer, and wherein said music bypass switch temporarily allows the security device to transfer data above said maximum bit-rate of the low bit-rate digital data while said music bypass switch is activated.

2. The audio security device of claim 1, wherein the maximum bit-rate of the low bit-rate digital data is limited by a physical non field programmable bit-rate limiter, wherein said maximum bit-rate of said outgoing low bit-rate digital data is intentionally limited to the minimal bit rate sufficient for transmitting compressed human speech.

3. The audio security device of claim 1, further comprising:
a tamper detector; and
a security function coupled to said tamper detector,
wherein said security function disables the operation of the security device when attempt to tamper with the security device is detected.

4. The audio security device of claim 3, wherein said security function further logs activity of the audio security device.

5. The audio security device of claim 4, and further comprising an authentication device coupled to said security function.

6. The audio security device of claim 1,
wherein said outgoing coding vocoder and said outgoing decoding vocoder are situated within said enclosure,
and wherein said outgoing coding vocoder is coupled to said outgoing decoding vocoder within said enclosure.

7. The audio security device of claim 1, wherein the security device is situated between a computer and at least one audio device selected from a group consisting of: a speaker; an earphone; a microphone and a headset.

8. The audio security device of claim 1, wherein the security device is integrated into a computer such that audio output from said computer is routed only via the security device.

9. The audio security device of claim 1, further comprising: an ingoing encoding vocoder
for receiving ingoing audio signal and compressing said ingoing audio signal to an ingoing low bit-rate digital data indicative of human speech in said ingoing audio signal; and an ingoing decoding vocoder
for receiving said ingoing low bit-rate digital data, and decompressing said ingoing low bit-rate digital data to a secure ingoing audio signal, wherein the maximum bit-rate of said ingoing low bit-rate digital data is intentionally limited to bit rate sufficient for transmitting compressed human speech.

10. The audio security device of claim 9, further comprising:
a microphone plug,
coupled to said ingoing decoding vocoder for plugging into an input jack of a computer; and
earphone plug,
coupled to said outgoing encoding vocoder for plugging into an output jack of the computer;
an enclosure,
wherein said outgoing coding vocoder, said outgoing decoding vocoder, said ingoing encoding vocoder and said ingoing decoding vocoder are situated within said enclosure,
wherein said outgoing coding vocoder is coupled to said outgoing decoding vocoder within said enclosure,
and wherein said ingoing coding vocoder is coupled to said ingoing decoding vocoder within said enclosure; and a lock for locking said enclosure to the computer,
wherein said enclosure covers said input jack and said output jack and prevents accessing them when said enclosure is locked to said computer.

11. The audio security device of claim 10, wherein said enclosure further comprises:
an output audio jack
coupled to said outgoing decoding vocoder; and
an audio input jack
coupled to said ingoing encoding vocoder.

12. The audio security device of claim 9, further comprising:
a digital audio interface
for interfacing with at least one audio device selected from a group consisting of: a speaker, an earphone, a microphone, and a headset; and
a CODEC function interfacing said digital audio interface with said ingoing encoding vocoder and said outgoing decoding vocoder.

13. The audio security device of claim 12, wherein said CODEC function is a USB CODEC.

14. The audio security device of claim 1, further comprising:
an enclosure,
wherein said outgoing coding vocoder and said outgoing decoding vocoder are situated within said enclosure,
and wherein said outgoing coding vocoder is coupled to said outgoing decoding vocoder within said enclosure; and
a physical lock,
attaching said enclosure to said audio output channel of said computer.

15. A computer system having secure audio channel comprising: at least a first computer having a first audio output channel;
an enclosure enclosing an audio security device, said enclosure is having: an audio jack and at least a first audio interface,
wherein said first audio output channel of said at least first computer is coupled to said first audio interface;
an output coding vocoder,
located within said enclosure,
for receiving output audio signal from said first output audio channel of said first computer,
said output coding vocoder is capable of compressing said first output audio signal from said first output audio channel to an output low bit-rate digital data indicative of human speech included in said first output audio signal;
an output decoding vocoder,
located within said enclosure,
and coupled to said outgoing coding vocoder for receiving said output low bit-rate digital data,
and decompressing said output low bit-rate digital data to a secure output audio signal and transmitting said secure output audio signal to said audio jack, wherein a maximum bit-rate of said output low bit-rate digital data is intentionally limited to bit rate sufficient for transmitting compressed human speech; and
an audio voice sounding peripheral
coupled to said audio jack,
wherein said secure output audio signal reproduces only said human speech included in said output audio signal when the audio security device is operated in a secure mode;
and further comprising:

a music ON switch;
a music bypass timer,
  wherein said music bypass timer is activated by said music ON switch;
a music ON indicator; and
a music bypass switch,
  wherein said music bypass switch and said music ON indicator are activated by said music timer,
and wherein said music bypass switch temporarily allows the security device to transfer data above said maximum bit-rate of the low bit-rate digital data while said music bypass switch is activated.

16. The computer system having secure audio channel of claim 15, further comprises:
a second computer having a second audio output channel;
wherein said enclosure is further having:
  a second audio interface,
    wherein said second audio output channel of said second computer is coupled to said second audio interface; and
  an audio switch,
    switching signal from one of: said first audio interface or said second audio interface to said output coding vocoder at a time,
    wherein audio signals of said selected one of said first computer or said second computer is always routed via said coding vocoder and said decoding vocoder when the audio security device is operated in a secure mode.

17. A method for hindering data leaks and data theft via audio channel of a computer system comprising:
receiving audio signal;
compressing said audio signal to a low bit-rate digital data indicative of the human speech included in said input signal using a coding vocoder;
intentionally limiting a maximum bit-rate of said low bit-rate digital data to bit rate sufficient for transmitting compressed human speech; and
decompressing said low bit-rate digital data to audio signal using a decoding vocoder,
wherein said coding vocoder and said decoding vocoder are not separated by a long range data transmission channel; and
activating for a preset duration a music bypass timer;
activating a music ON indicator; and
activating a music bypass switch, wherein said music bypass switch and said music ON indicator are activated by said music timer,
and wherein said music bypass switch temporarily allows the security device to transfer data above said maximum bit-rate of the low bit-rate digital data while said music bypass switch is activated.

18. The method for hindering data leaks and data theft of claim 17, further comprising:
monitoring the audio signals for attempt to transmit non-human speech data; and
disabling the transmission of signals when attempt to transmit non-human speech data is detected.

19. The method for hindering data leaks and data theft of claim 17, wherein said audio signal is extracted from composite video signal.

* * * * *